United States Patent
Morinaga

(10) Patent No.: US 6,721,935 B2
(45) Date of Patent: Apr. 13, 2004

(54) COORDINATE TRANSFORMATION SYSTEM FOR SEMICONDUCTOR DEVICE, COORDINATE TRANSFORMATION METHOD AND COORDINATE TRANSFORMATION PROGRAM

(75) Inventor: Hiroyuki Morinaga, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/115,974

(22) Filed: Apr. 5, 2002

(65) Prior Publication Data

US 2002/0184604 A1 Dec. 5, 2002

(30) Foreign Application Priority Data

Apr. 5, 2001 (JP) ................................. P2001-107409

(51) Int. Cl.⁷ .............................................. G06F 17/50
(52) U.S. Cl. ................................ 716/11; 716/4; 716/8; 716/9; 716/10
(58) Field of Search ................................ 714/718–720, 714/723, 733, 738, 739; 345/501, 563, 807; 716/1–11

(56) References Cited

U.S. PATENT DOCUMENTS

| | | | | |
|---|---|---|---|---|
| 5,129,060 A | * | 7/1992 | Pfeiffer et al. | 345/563 |
| 5,146,592 A | * | 9/1992 | Pfeiffer et al. | 345/807 |
| 5,535,134 A | * | 7/1996 | Cohn et al. | 716/8 |
| 5,994,913 A | | 11/1999 | Lee | |
| 6,061,813 A | * | 5/2000 | Goishi | 714/718 |
| 6,360,341 B1 | * | 3/2002 | Yoshinaga | 714/718 |
| 6,502,216 B1 | * | 12/2002 | Takano | 714/738 |
| 6,505,324 B1 | * | 1/2003 | Cowan et al. | 716/4 |

FOREIGN PATENT DOCUMENTS

| JP | 11-251389 | 9/1999 |
|---|---|---|
| JP | 2001-84793 | 3/2001 |

OTHER PUBLICATIONS

Tanoi et al., "On–Wafer BIST of a 200Gb/s Failed–Bit Search for 1Gb DRAM", IEEE, p. 70–73, 1997.*
Ubar, R.et al.; "Generation of tests for the localization of single gate design errors in combinational circuits using the stuck–at fault model"; XI Brazilian Symposium on 30 Sep.–3 Oct. 1998. Page(s): 51–54.*
Yoshimura, et al.; "A three-dimensional sensor for automatic visual inspection of soldered parts"; 15th Annual Conference of IEEE, Nov. 6–10, 1989; Page(s): 562–567 vol. 3.*

* cited by examiner

Primary Examiner—Vuthe Siek
Assistant Examiner—Naum Levin
(74) Attorney, Agent, or Firm—Oblon, Spivak, McClelland, Maier & Neustadt, P.C.

(57) ABSTRACT

A coordinate transformation system includes: a layout display unit configured to obtain an arbitrary point in layout data of a semiconductor device as a coordinate value of an FBM physical coordinate system indicative of a physical position; a pattern defining unit configured to define the relationship between an FBM physical address and the FBM physical coordinates using a pattern tree obtained by combining an array pattern, defining lining direction, interval, and the number of components to be disposed at equal intervals, with a random pattern, defining the relationship between the FBM physical address as a coordinate system of FBM data indicative of an electric failure position obtained by a test process of the semiconductor device and the FBM physical coordinates in a one-to-one corresponding manner; and a program generating unit configured to generate a program to transform the FBM physical address into the FBM physical coordinates from the pattern defined.

27 Claims, 58 Drawing Sheets

RELATIVE COORDINATE OF LAYOUT ORIGIN O1
AND FBM PHYSICAL COORDINATE ORIGIN O3

FIG.16

PATTERN NAME : P0

| ADDRESS (X,Y) IN PATTERN OR BLOCK NUMBER | PHYSICAL COORDINATES IN PATTERN | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|
| (0,0) – (0,0) | (0,0) | CELL | (1,1) | (0,0) | (0,0) |
| (0,1) – (0,1) | (2,1) | CELL | (1,1) | (0,0) | (0,0) |
| (0,2) – (0,2) | (2,4) | CELL | (1,1) | (0,0) | (0,0) |
| (0,3) – (0,3) | (0,3) | CELL | (1,1) | (0,0) | (0,0) |

PATTERN OUTER FRAME OF PATTERN P0

| START POINT OF PATTERN OUTER FRAME | END POINT OF PATTERN OUTER FRAME |
|---|---|
| (0,0) | (2,4) |

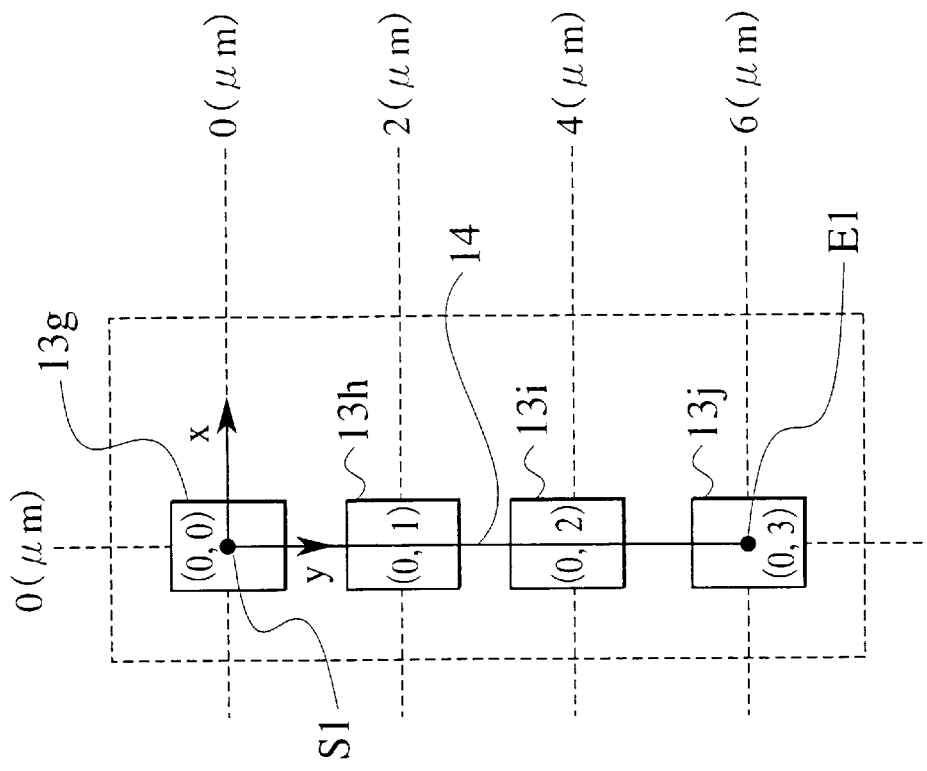
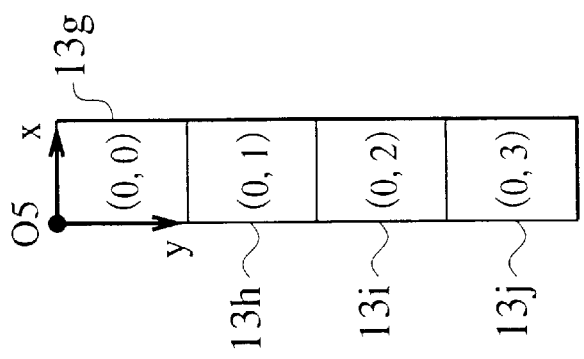

FIG.18

PATTERN NAME: P1

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| Y | 2 | 4 | CELL | (1, 1) | (0, 0) | (0, 0) |

PATTERN OUTER FRAME OF PATTERN P1

| START POINT OF PATTERN OUTER FRAME | END POINT OF PATTERN OUTER FRAME |
|---|---|
| (0, 0) | (0, 6) |

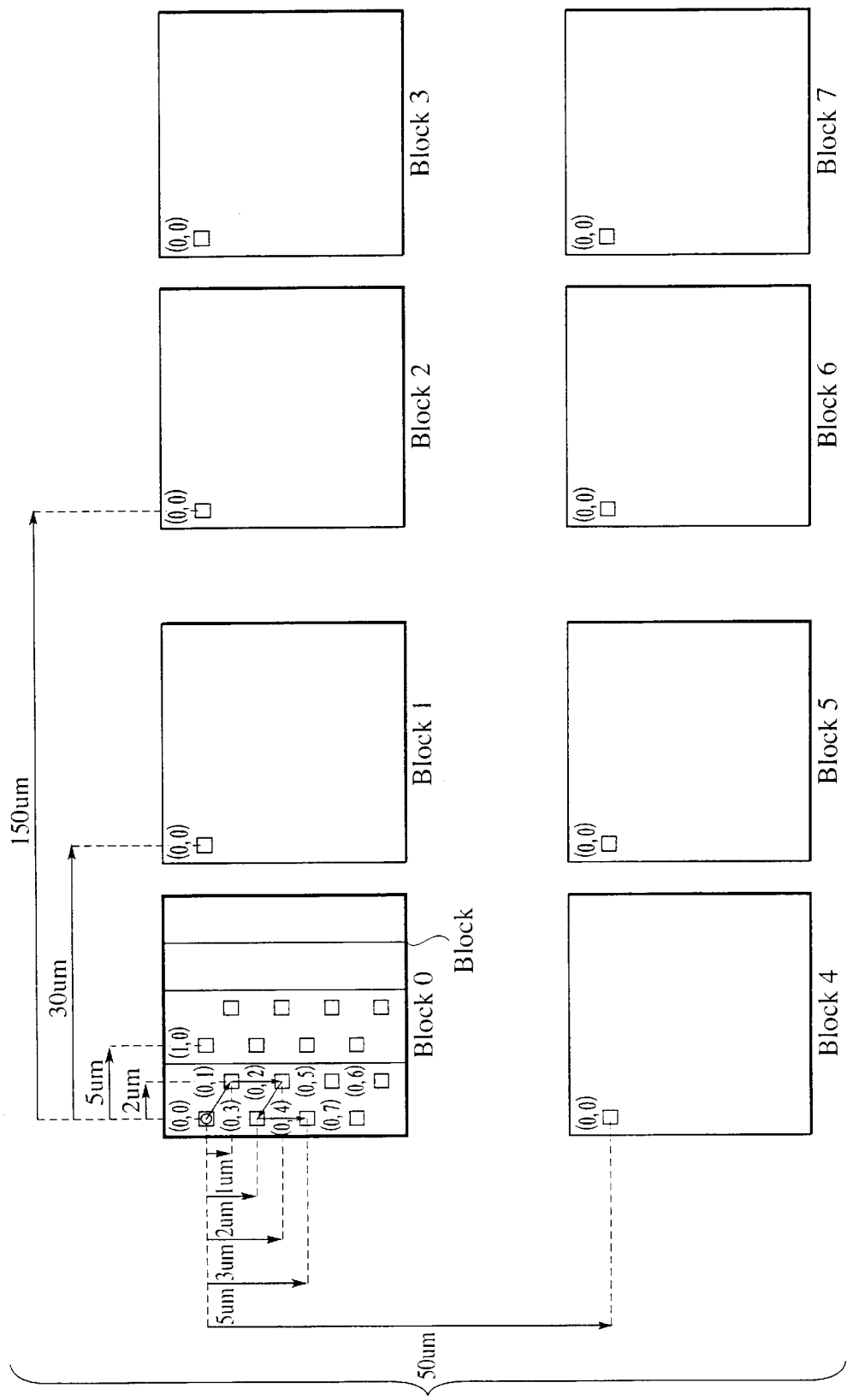

FIG.21

PATTERN NAME : P0 (RANDOM PATTERN)

| ADDRESS (X,Y) IN PATTERN OR BLOCK NUMBER | PHYSICAL COORDINATES IN PATTERN | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|
| (0, 0) - (0, 0) | (0, 0) | CELL | (1, 1) | (0, 0) | (0, 0) |
| (0, 1) - (0, 1) | (2, 1) | CELL | (1, 1) | (0, 0) | (0, 0) |
| (0, 2) - (0, 2) | (2, 3) | CELL | (1, 1) | (0, 0) | (0, 0) |
| (0, 3) - (0, 3) | (0, 2) | CELL | (1, 1) | (0, 0) | (0, 0) |

PATTERN OUTER FRAME OF PATTERN P0

| START POINT OF PATTERN OUTER FRAME | END POINT OF PATTERN OUTER FRAME |
|---|---|
| (0, 0) | (2, 3) |

FIG.22

PATTERN NAME : P1 (ARRAY PATTERN)

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| Y | 5 | 2 | P0 | (1, 4) | (0, 0) | (2, 3) |

PATTERN OUTER FRAME OF PATTERN P1

| START POINT OF PATTERN OUTER FRAME | END POINT OF PATTERN OUTER FRAME |
|---|---|
| (0, 0) | (2, 8) |

FIG.23

PATTERN NAME : P2 (ARRAY PATTERN) DEFINED AS BLOCKS

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| X | 5 | 4 | P1 | (1, 8) | (0, 0) | (2, 8) |

PATTERN OUTER FRAME OF PATTERN P2

| START POINT OF PATTERN OUTER FRAME | END POINT OF PATTERN OUTER FRAME |
|---|---|
| (0, 0) | (17, 8) |

FIG.24

PATTERN NAME : P3 (ARRAY PATTERN)

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| X | 30 | 2 | P2 | 1 BLOCK | (0, 0) | (17, 8) |

PATTERN OUTER FRAME OF PATTERN P3

| START POINT OF PATTERN OUTER FRAME | END POINT OF PATTERN OUTER FRAME |
|---|---|
| (0, 0) | (47, 8) |

FIG.25

PATTERN NAME : P4 (ARRAY PATTERN)

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| X | 150 | 2 | P3 | 2 BLOCKS | (0, 0) | (47, 8) |

PATTERN OUTER FRAME OF PATTERN P4

| START POINT OF PATTERN OUTER FRAME | END POINT OF PATTERN OUTER FRAME |
|---|---|
| (0, 0) | (197, 8) |

FIG.26

PATTERN NAME : P5 (ARRAY PATTERN)

| LINING DIRECTION | INTERVAL ($\mu$m) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| Y | 50 | 2 | P4 | 4 BLOCKS | (0, 0) | (197, 8) |

PATTERN OUTER FRAME OF PATTERN P5

| START POINT OF PATTERN OUTER FRAME | END POINT OF PATTERN OUTER FRAME |
|---|---|
| (0, 0) | (197, 58) |

FIG.29

PATTERN NAME : P1 (ARRAY PATTERN)

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| Y | 5 | 2 | P0 | (1, 4) | (0, 0) | (0, 0) |

PATTERN P1(ARRAY)

30a-1 — off_y = off_y + Int (cur_addr_y/4) * 5

30a-2 — cur_addr_y = (cur_addr_y Mod 4)

PATTERN NAME : P5 (ARRAY PATTERN)

| LINING DIRECTION | INTERVAL ($\mu m$) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| Y | 50 | 2 | P4 | 4 BLOCKS | (0, 0) | (197, 8) |

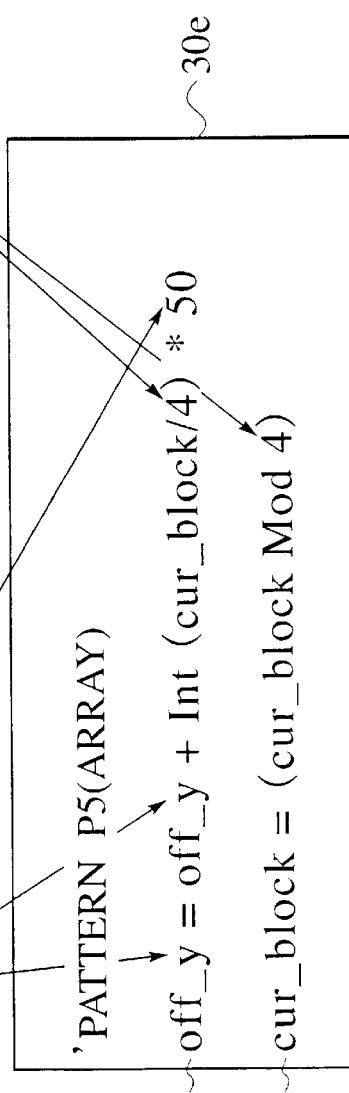

'PATTERN P5(ARRAY)
30e-1 — off_y = off_y + Int (cur_block/4) * 50
30e-2 — cur_block = (cur_block Mod 4)

FIG. 31A

```
Sub convert (fbmno As Long, FBM_x As Long, FBM_y As Long, fbm_phys_x As Long, fbm_phys_y As Long)
' fbmno       'INPUT : BLOCK NUMBER
' FBM_x       'INPUT : ADDRESS x
' FBM_y       'INPUT : ADDRESS y
' fbm_phys_x  'OUTPUT : FBM PHYSICAL COORDINATE X
' fbm_phys_y  'OUTPUT : FBM PHYSICAL COORDINATE Y ' DECLARATION OF INTERNAL VARIABLE
Dim off_x As Long, off_y As Long   'FBM PHYSICAL COORDINATE VALUES
Dim cur_addr_x As Long, cur_addr_y As Long, cur_blk As Long ' INITIAL VALUE SETTING
cur_blk = fbmno
cur_addr_x = FBM_x
cur_addr_y = FBM_y ' INITIALIZATION OF OFFSET
off_x = 0
off_y = 0
```
/10a

```
' PATTERN P5 (ARRAY)
off_y = off_y + Int(cur_blk/4) * 50
cur_blk = (cur_blk Mod 4)
```
/30e

```
' PATTERN P4 (ARRAY)
off_x = off_x + Int(cur_blk/2) * 150
cur_blk = (cur_blk Mod 2)
```
/30d

```
' PATTERN P3 (ARRAY)
off_x = off_x + Int(cur_blk/1) * 30
cur_blk = (cur_blk Mod 1)
```
/30c

FROM FIG. 31A

```
'PATTERN P2 (ARRAY)
off_x = off_x + Int(cur_addr_x/1) * 5
cur_addr_x = (cur_addr_x Mod 1)
```
— 30b

```
'PATTERN P1 (ARRAY)
off_y = off_y + Int(cur_addr_y/4) * 5
cur_addr_y = (cur_addr_y Mod 4)
```
— 30a

```
'PATTERN P0 (RANDOM)
If (0<= cur_addr_x And cur_addr_x <=0) And (0<= cur_addr_y And cur_addr_y <=0) Then
    off_x = off_x + 0
    off_y = off_y + 0
    cur_addr_x = cur_addr_x - 0
    cur_addr_y = cur_addr_y - 0
ElseIf (0<= cur_addr_x And cur_addr_x <=0) And (1<= cur_addr_y And cur_addr_y <=1) Then
    off_x = off_x + 2
    off_y = off_y + 1
    cur_addr_x = cur_addr_x - 0
    cur_addr_y = cur_addr_y - 1
ElseIf (0<= cur_addr_x And cur_addr_x <=0) And (2<= cur_addr_y And cur_addr_y <=2) Then
    off_x = off_x + 2
    off_y = off_y + 3
    cur_addr_x = cur_addr_x - 0
    cur_addr_y = cur_addr_y - 2
ElseIf (0<= cur_addr_x And cur_addr_x <=0) And (3<= cur_addr_y And cur_addr_y <=3) Then
    off_x = off_x + 0
    off_y = off_y + 2
    cur_addr_x = cur_addr_x - 0
    cur_addr_y = cur_addr_y - 3
End If
```
— 20

```
fbm_phys_x = off_x
fbm_phys_y = off_y

End Sub
```
— 10b

FIG. 34A

```
'DEFINITION OF STRUCTURE
Public Type CurInfoDef
    cur_block As Long      'CURRENT BLOCK NUMBER
    cur_x  As Long         'CURRENT ADDRESS x
    cur_y  As Long         'CURRENT ADDRESS x
    Xdef As Long
    Ydef As Long
    Tolerance As Long
End Type 'ANALYSIS OF ARRAY PATTERN
Function array_pat(direction As String, x1 As Long, y1 As Long, x2 As Long, y2 As Long, _
                   offset As Long, n As Long, child_pat_x As Long, child_pat_y As Long, _
                   child_pat_block As Long, Loc As CurInfoDef) As Boolean Dim Xloc As Long
Dim Yloc As Long
Dim k As Double
Dim a As Long If UCase(direction) = "X" Then                                               ----- Step 31
    'OBTAIN k (ONLY IN THE x DIRECTION)
    k = (offset + x1 - x2)/2
    'OBTAIN a (ONLY IN THE x DIRECTION)                                      ----- Step 32
    a = Int((Loc.Xdef + k)/offset)

'WHEN a IS EQUAL TO OR LARGER THAN (THE DEFINED NUMBER -1),
    If a >= n Then a = n - 1                                                 } Step 33

'WHEN a IS A NEGATIVE VALUE, a = 0
    If a < 0 Then a = 0

'PHYSICAL COORDINATE (ONLY IN THE x DIRECTION)
    DEFECT IN CHILD PATTERN
    Xloc = Loc.Xdef - a * offset                                             } Step 34
    Yloc = Loc.Ydef 'ADD ADDRESS (ONLY IN THE x DIRECTION)
    Loc.cur_x = Loc.cur_x + a * child_pat_x
    Loc.cur_block = Loc.cur_block + a * child_pat_block
```

Step 33, Step 34 } PROCESS IN X DIRECTION

FIG.34B                    FROM FIG.34A

```
Else
    k = (offset + y1 - y2)/2                                    ----- Step 32
    'OBTAIN a (ONLY IN THE y DIRECTION)
    a = Int((Loc. Ydef + k)/offset)

'WHEN a IS EQUAL TO OR LARGER THAN                          ⎫
    (THE DEFINED NUMBER - 1), a = (DEFINED NUMBER - 1)          ⎬ Step 33
    If a >= n Then a = n - 1                                    ⎭

'WHEN a IS A NEGATIVE VALUE, a = 0                          ⎫
    If a < 0 Then a = 0                                         ⎬          PROCESS IN
                                                                           Y DIRECTION
    'PHYSICAL COORDINATES (ONLY IN THE x DIRECTION) OF          ⎫
    DEFECT IN CHILD PATTERN                                     ⎪
    Xloc = Loc. Xdef                                            ⎬ Step 34
    Yloc = Loc. Ydef - a * offset                               ⎪
                                                                ⎪
    'ADD ADDRESS (ONLY IN THE x DIRECTION)                      ⎪
    Loc. cur_y = Loc. cur_y + a * child_pat_y                   ⎪
    Loc. cur_block = Loc. cur_block + a * child_pat_block       ⎭
Else If
    'CHECK TO SEE IF IT IS WITHIN TOLERANCE                     ⎫
    If ((x1 - Loc. Tolerance) <= Xloc) And (Xloc <= (x2 + Loc. Tolerance)) And_  ⎪
    ((y1 - Loc. Tolerance) <= Yloc) And (Yloc <= (y2 + Loc. Tolerance)) Then     ⎬ Step 35
    Else                                                        ⎪
        'OUT OF TOLERANCE                                       ⎪
        array_pat = False                                       ⎪
        'INTRANSFORMABLE                                        ⎪
        Exit Function                                           ⎭
    End If
    'CALCULATE PHYSICAL COORDINATES IN CHILD PATTERN            ⎫
    Loc. Xdef = Xloc                                            ⎬ Step 36
    Loc. Ydef = Yloc                                            ⎭

'TRANSFORM SUCCEEDED
    array_pat = True
End Function
```

```
'ANALYSIS OF ARRAY PATTERN
Function array_pat(direction As String, x1 As Double, y1 As Double, x2 As Double, y2 As Double, _
    offset As Double, n As Long, _
    child_pat_block As Long, child_pat_x As Long, child_pat_y As Long, _
    Loc As CurInfoDef) As Boolean Dim Xloc As Double
Dim Yloc As Double
Dim k As Double
Dim a As Long If UCase(direction) = "X" Then
    'OBTAIN k (ONLY IN THE x DIRECTION)
    k = (offset + x1 - x2)/2
    'OBTAIN a (ONLY IN THE x DIRECTION)
    a = Int((Loc.Xdef + k)/offset)

' IF a IS EQUAL TO OR LARGER THAN (DEFINED NUMBER - 1), a = (DEFINED NUMBER - 1)
    If a >= n Then a = n - 1

' IF a IS NEGATIVE, a = 0
    If a < 0 Then a = 0

'PHYSICAL COORDINATE (ONLY IN THE x DIRECTION) OF DEFECT IN CHILD PATTERN
    Xloc = Loc.Xdef - a * offset
    Yloc = Loc.Ydef 'ADD ADDRESS (ONLY IN THE x DIRECTION)
    Loc.cur_x = Loc.cur_x + a * child_pat_x
    Loc.cur_block = Loc.cur_block + a * child_pat_block
Else
    k = (offset + y1 - y2)/2
    'OBTAIN a (ONLY IN THE y DIRECTION)
    a = Int((Loc.Ydef + k)/offset)
```

FROM FIG.40A

```
'IF a IS EQUAL TO OR LARGER THAN (DEFINED NUMBER - 1), a = (DEFINED NUMBER - 1)
 If a >= n Then a = n - 1

'IF a IS NEGATIVE, a = 0
 If a < 0 Then a = 0

'PHYSICAL COORDINATE (ONLY IN THE y DIRECTION) OF DEFECT IN CHILD PATTERN
 Xloc = Loc. Xdef
 Yloc = Loc. Ydef - a * offset 'ADD ADDRESS (ONLY IN THE x DIRECTION)
 Loc. cur_y = Loc. cur_y + a * child_pat_y
 Loc. cur_block = Loc. cur_block + a * child_pat_block Else If
'CHECK TO SEE IF IT IS WITHIN TOLERANCE
 If ({x1 - Loc. Tolerance} <= Xloc) And (Xloc <= {x2 + Loc. Tolerance}) And_
   ({y1 - Loc. Tolerance} <= Yloc) And (Yloc <= {y2 + Loc. Tolerance}) Then
 Else
'OUT OF TOLERANCE
  MsgBox "OUT OF TOLERANCE"
  array_pat = False
'INTRANSFORMABLE
  Exit Function
 End If 'CALCULATE PHYSICAL COORDINATES IN CHILD PATTERN
 Loc. Xdef = Xloc
 Loc. Ydef = Yloc 'SUCCEEDED IN TRANSFORMATION
 array_pat = True End Function
```

```
'OBTAIN DISTANCE BETWEEN PATTERN AND POINT TO BE TRANSFORMED (DEFECT)
Sub calc_s_pat.(no As Long,_
        Block As Long, addr_x As Long, addr_y As Long,_
        Xcell As Double, Ycell As Double,_
        loc_x1 As Double, loc_y1 As Double, loc_x2 As Double, loc_y2 As Double,_
        near_pat As NearPatType, Loc As CurInfoDef)

Dim s As Double
    Dim x1 As Double
    Dim x2 As Double
    Dim y1 As Long
    Dim y2 As Long x1 = loc_x1 + Xcell
    x2 = loc_x2 + Xcell
    y1 = loc_y1 + Ycell
    y2 = loc_y2 + Ycell 'IN THE CASE OF AREA A1
    If (x1 <= Loc.Xdef) And (Loc.Xdef <= x2) And (y1 <= Loc.Ydef) And (Loc.Ydef <= y2) Then
        s = 0
'IN THE CASE OF AREA A2
    ElseIf (x1 <= Loc.Xdef) And (Loc.Xdef <= x2) Then
        IfLoc.Ydef < y1 Then
            s = y1 - Loc.Ydef
        Else
            s = Loc.Ydef - y2
        End If
'IN THE CASE OF AREA A3
    ElseIf (y1 <= Loc.Ydef) And (Loc.Ydef <= y2) Then
        IfLoc.Xdef < x1 Then
            s = x1 - Loc.Xdef
```

FROM FIG.41A

```
    Else
        s = Loc. Xdef - x2
    End IF
'IN THE CASE OF AREA A4
ElseIf (Loc. Xdef < x1) And (Loc. Ydef < y1) Then
    s = max(x1 - Loc. Xdef, y1 - Loc. Ydef)
'IN THE CASE OF AREA A5
ElseIf (Loc. Xdef < x1) And (y2 < Loc. Ydef) Then
    s = max(x1 - Loc. Xdef, Loc. Ydef - y2)
'IN THE CASE OF AREA A6
ElseIf (x2 < Loc. Xdef) And (y2 < Loc. Ydef) Then
    s = max(Loc. Xdef - x2, Loc. Ydef - y2)
'IN THE CASE OF AREA A7
ElseIf (x2 < Loc. Xdef) And (Loc. Ydef < y1) Then
    s = max(Loc. Xdef - x2, y1 - Loc. Ydef)
End If
'COMPARE THE OBTAINED DISTANCE WITH THE MINIMUM VALUE s.
'IF IT IS SMALLER THAN THE MINIMUM VALUE, ADDITION ADDRESS IS UPDATED TO min_s
If near_pat. min_s >= s Then
    near_pat. min_s = s
    near_pat. min_pat_addr_x = addr_x
    near_pat. min_pat_addr_y = addr_y
    near_pat. min_pat_block = block
    near_pat. min_no = no
End If End Sub
```

```
'OBTAIN DISTANCE BETWEEN CELL AND POINT TO BE TRANSFORMED (DEFECT)
Sub calc_s_cell (no As Long,_
        block As Long, addr_x As Long, addr_y As Long,_
        Xcell As Double, Ycell As Double,_
        near_pat As NearPatType, Loc As CurInfoDef)

Dim s As Double

'SELECT LARGER s
    s = max(Abs(Loc.Xdef - Xcell), Abs(Loc.Ydef - Ycell))

'COMPARE OBTAINED DISTANCE WITH MINIMUM s.
    'IF IT IS SMALLER THAN s, ADDITION ADDRESS IS UPDATED TO min_s.
    If near_pat.min_s >= s Then
        near_pat.min_s = s
        near_pat.min_pat_addr_x = addr_x
        near_pat.min_pat_addr_y = addr_y
        near_pat.min_pat_block = block
        near_pat.min_no = no
    End If
End Sub
```

```
'RETURN LARGER ONE OF TWO VALUES
Function max(s1 As Double, s2 As Double) As Double If s1 <0 Or s2 <0 Then
    MsgBox "NEGATIVE VALUE IS FOUND"
End If 'SELECT LARGER ONE
If s1 >= s2 Then
    max = s1
Else
    max = s2
End If End Function
```
44

FIG.44

```
Public Type CurInfoDef
    cur_block As Long        'CURRENT BLOCK NUMBER
    cur_x As Long            'CURRENT ADDRESS x
    cur_y As Long            'CURRENT ADDRESS x
    Xdef As Double
    Ydef As Double
    Tolerance As Double
End Type Public Type NearPatType
    min_s As Double          'DISTANCE BETWEEN POINT TO BE TRANSFORMED AND NEAREST PATTERN
    min_no As Long           'SERIAL NUMBER OF NEAREST PATTERN
    min_pat_block As Long    'BLOCK OF NEAREST PATTERN
    min_pat_addr_x As Long   'ADDRESS x OF NEAREST PATTERN
    min_pat_addr_y As Long   'ADDRESS y OF NEAREST PATTERN
End Type
```

```
'###########################################
' ENTRY POINT
'###########################################

'TRANSFORM FBM PHYSICAL COORDINATE TO FBM ADDRESS
Sub ConvertPhys2FBM(Loc As CurInfoDef)
    Call P5(Loc)
End Sub
```

PATTERN NAME : P5 (ARRAY PATTERN)

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| Y | 50 | 2 | P4 | 4 BLOCKS | (0, 0) | (197, 8) |

PATTERN OUTER FRAME OF PATTERN P5

| START POINT OF PATTERN OUTER FRAME | END POINT OF PATTERN OUTER FRAME |
|---|---|
| (0, 0) | (197, 58) |

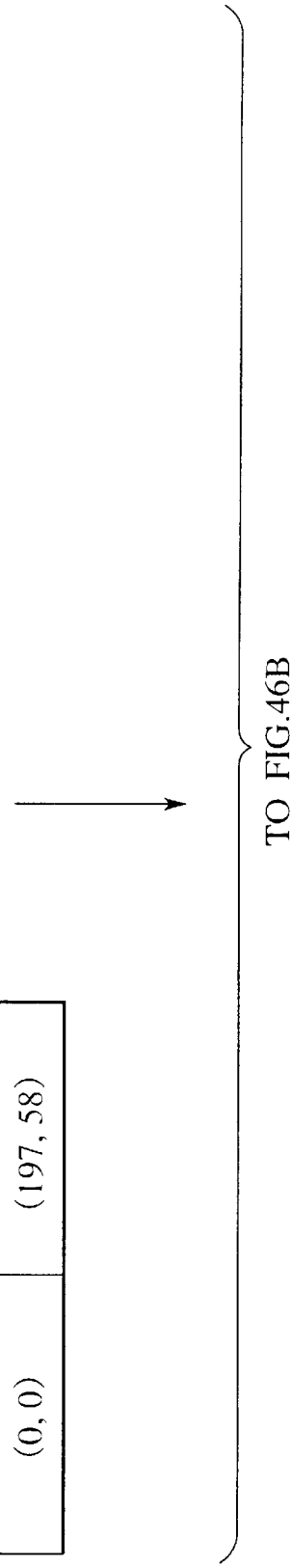

FROM FIG.46A

```
'################################
' PATTERN FUNCTION
'################################

' ARRAY PATTERN P5

Public Sub P5(Loc As CurInfoDef)

' LINING DIRECTION IS y DIRECTION
    ' OUTER FRAME START POINT (x1,y1)
    ' OUTER FRAME END POINT (x2,y2)
    ' INTERVAL
    ' THE NUMBER OF PATTERNS LINED
    ' THE SIZE OF CHILD PATTERN (BLOCK OR x, y)

' PROCESS ON PATTERN P5
    Call array_pat("Y", 0, 0, 197, 8, 50, 2, 4, 0, 0, Loc)

' SHIFT PROCESS ONTO CHILD PATTERN
    Call P4(Loc)

End Sub
```

PATTERN NAME : P4 (ARRAY PATTERN)

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| X | 150 | 2 | P3 | 2 BLOCKS | (0, 0) | (47, 8) |

PATTERN OUTER FRAME OF PATTERN P4

| START POINT OF PATTERN OUTER FRAME | END POINT OF PATTERN OUTER FRAME |
|---|---|
| (0, 0) | (197, 8) |

TO FIG.47B

FIG.47B    FROM FIG.47A

```
' ARRAY PATTERN P4

Public Sub P4(Loc As CurInfoDef)

' LINING DIRECTION IS y DIRECTION
' OUTER FRAME START POINT (x1, y1)
' OUTER FRAME END POINT (x2, y2)
' INTERVAL
' THE NUMBER OF PATTERNS LINED
' THE SIZE OF CHILD PATTERN (BLOCK OR x, y)

' PROCESS ON PATTERN P4
Call array_pat("X", 0, 0, 47, 8, 150, 2, 2, 0, 0, Loc)

' SHIFT PROCESS ONTO CHILD PATTERN
Call P3(Loc)

End Sub
```

PATTERN NAME : P3 (ARRAY PATTERN)

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| X | 30 | 2 | P2 | 1 BLOCK | (0, 0) | (17, 8) |

PATTERN OUTER FRAME OF PATTERN P3

| START POINT OF PATTERN OUTER FRAME | END POINT OF PATTERN OUTER FRAME |
|---|---|
| (0, 0) | (47, 8) |

FROM FIG.48A

```
'ARRAY PATTERN P3

Public Sub P3(Loc As CurInfoDef)

'LINING DIRECTION IS y DIRECTION
    'OUTER FRAME START POINT (x1, y1)
    'OUTER FRAME END POINT (x2, y2)
    'INTERVAL
    'THE NUMBER OF PATTERNS LINED
    'THE SIZE OF CHILD PATTERN (BLOCK OR x, y)

'PROCESS ON PATTERN P3
    Call array_pat("X", 0, 0, 17, 8, 30, 2, 1, 0, 0, Loc)

'SHIFT PROCESS ONTO CHILD PATTERN
    Call P2(Loc)

End Sub
```

PATTERN NAME : P2 (ARRAY PATTERN) DEFINED AS BLOCKS

| LINING DIRECTION | INTERVAL ($\mu m$) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| X | 5 | 4 | P1 | (1, 8) | (0, 0) | (2, 8) |

PATTERN OUTER FRAME OF PATTERN P2

| START POINT OF PATTERN OUTER FRAME | END POINT OF PATTERN OUTER FRAME |
|---|---|
| (0, 0) | (17, 8) |

FROM FIG.49A

```
'ARRAY PATTERN P2

Public Sub P2(Loc As CurInfoDef)

'LINING DIRECTION IS y DIRECTION
'OUTER FRAME START POINT (x1, y1)
'OUTER FRAME END POINT (x2, y2)
'INTERVAL
'THE NUMBER OF PATTERNS LINED
'THE SIZE OF CHILD PATTERN (BLOCK OR x, y)

'PROCESS ON PATTERN P2
Call array_pat( "X", 0, 0, 2, 8, 5, 4, 0, 1, 8, Loc)

'SHIFT PROCESS ONTO CHILD PATTERN
Call P1 (Loc)

End Sub
```

PATTERN NAME : P1 (ARRAY PATTERN)

| LINING DIRECTION | INTERVAL (μm) | THE NUMBER OF REPETITION TIMES | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|---|
| Y | 5 | 2 | P0 | (1, 4) | (0, 0) | (2, 3) |

PATTERN OUTER FRAME OF PATTERN P1

| START POINT OF PATTERN OUTER FRAME | END POINT OF PATTERN OUTER FRAME |
|---|---|
| (0, 0) | (2, 8) |

FROM FIG.50A

```
'ARRAY PATTERN P1

Public Sub P1(Loc As CurInfoDef)

'LINING DIRECTION IS y DIRECTION
   'OUTER FRAME START POINT (x1, y1)
   'OUTER FRAME END POINT (x2, y2)
   'INTERVAL
   'THE NUMBER OF PATTERNS LINED
   'THE SIZE OF CHILD PATTERN (BLOCK OR x, y)
   'PROCESS ON PATTERN P1
   Call array_pat("Y", 0, 0, 2, 3, 5, 2, 0, 1, 4, Loc)

'SHIFT PROCESS ONTO CHILD PATTERN
   Call P0(Loc)

End Sub
```

PATTERN NAME : P0 (RANDOM PATTERN)

| ADDRESS (X, Y) IN PATTERN OR BLOCK NUMBER | PHYSICAL COORDINATES IN PATTERN | COMPONENT CELL OR PATTERN NAME | THE NUMBER OF CELLS OR BLOCKS IN COMPONENT (AUTOMATICALLY CALCULATED) | START POINT OF PATTERN OUTER FRAME OF COMPONENT | END POINT OF PATTERN OUTER FRAME OF COMPONENT |
|---|---|---|---|---|---|
| (0,0) – (0,0) | (0,0) | CELL | (1,1) | (0,0) | (0,0) |
| (0,1) – (0,1) | (2,1) | CELL | (1,1) | (0,0) | (0,0) |
| (0,2) – (0,2) | (2,3) | CELL | (1,1) | (0,0) | (0,0) |
| (0,3) – (0,3) | (0,2) | CELL | (1,1) | (0,0) | (0,0) |

PATTERN OUTER FRAME OF PATTERN P0

| START POINT OF PATTERN OUTER FRAME | END POINT OF PATTERN OUTER FRAME |
|---|---|
| (0,0) | (2,3) |

→ 57

```
'RANDOM PATTERN P0
Public Sub P0(Loc As CurInfoDef)

Dim near_pat AS NearPatType

'SET INITIAL VALUE
near_pat.min_s = 100000000
```

FROM FIG.51A

```
' OBTAIN DISTANCE BETWEEN CELL AND POINT TO BE TRANSFORMED (DEFECT)
' SERIAL NUMBER IN PATTERN, ADDRESS (BLOCK, x, y) OF CELL, PHYSICAL COORDINATES (x,y) OF CELL
' (0, 0)
Call calc_s_cell(0, 0, 0, 0, 0, 0, near_pat, Loc)
' (1, 0)
Call calc_s_cell(1, 0, 0, 1, 2, 1, near_pat, Loc)
' (2, 0)
Call calc_s_cell(2, 0, 0, 2, 2, 3, near_pat, Loc)
' (3, 0)
Call calc_s_cell(3, 0, 0, 3, 0, 2, near_pat, Loc)

' WITHIN TOLERANCE ?
If near_pat.min_s > Loc.Tolerance Then
    MsgBox "OUT OF TOLERANCE"
    End
End If ' ADD ADDRESS
Loc.cur_x = Loc.cur_x + near_pat.min_pat_addr_x
Loc.cur_y = Loc.cur_y + near_pat.min_pat_addr_y
Loc.cur_block = Loc.cur_block + near_pat.min_pat_block ' JUMP TO NEXT PATTERN
Select Case near_pat.min_no
    Case 0   ' CELL (0, 0)
        Exit Sub
    Case 1   ' CELL (0, 1)
        Exit Sub
    Case 2   ' CELL (0, 2)
        Exit Sub
    Case 3   ' CELL (0, 3)
        Exit Sub
End Select End Sub
```

```
Dim Loc As CurInfoDef

Loc. Tolerance = 10

'INITIALIZE
Loc. cur_block = 0
Loc. cur_x = 0
Loc. cur_y = 0

'ENTER COORDINATES OF DEFECT
Loc. Xdef = 196.5
Loc. Ydef = 56.3

'ENTER INVERSE TRANSFORMATION
Call ConvertPhys2FBM(Loc)

'RESULT
MsgBox "BLOCK NUMBER = " & Loc. cur_block
MsgBox "ADDRESS x= " & Loc. cur_x
MsgBox "ADDRESS y = " & Loc. cur_y
```

60

COORDINATE TRANSFORMATION SYSTEM FOR SEMICONDUCTOR DEVICE, COORDINATE TRANSFORMATION METHOD AND COORDINATE TRANSFORMATION PROGRAM

CROSS REFERENCE TO RELATED APPLICATIONS

This application claims benefit of priority under 35 USC §119 to Japanese Patent Application No. 2001-107409 filed on Apr. 5, 2001, the entire contents of which are incorporated by reference herein.

BACKGROUND OF THE INVENTION

1. Field of the Invention

The present invention pertains to a technique for specifying a defect causing an electric failure by checking electric failure data obtained in a test process of a semiconductor device against defect data obtained in an inspection process.

2. Description of Related Art

As semiconductor integrated circuit technology rapidly progresses, the number of chips mounted on a single wafer is dramatically increasing and the chips are becoming more complicated. Consequently, in order to specify the cause of a defect, it is very important to specify the defect truly responsible for an electric failure by checking defect data indicative of the existence and position of foreign matter, defects, or the like on a semiconductor wafer obtained in a defect inspection process in a semiconductor device fabricating process against fail bit map (herein below, abbreviated as "FBM") data indicative of the position of an electric failure in a semiconductor chip obtained in a test process.

In the defect inspection process, coordinates and the size of a defect are detected. A coordinate system of defect data as a result of detection is a rectangular physical coordinate system having one origin for one chip. In contrast, for the FBM data obtained in the test process, a coordinate system in which the position of an electric failure corresponds to a physical address is used.

Therefore, in the case of checking the defect data against the FBM data in such a manner, coordinate transformation has to be performed so that the coordinate system of the defect data and the coordinate system of the FBM data coincide with each other. Usually, a failure address (physical address) of the FBM data is subjected to coordinate transformation bit by bit so as to make the coordinate system of the FBM data coincide with the coordinate system of the defect data and, after that, the defect data and the FBM data are checked against each other.

Conventionally, such a coordinate transformation means is realized by a mathematical expression, a program, or the like generated by human means. Consequently, as the scale and complication of a memory cell increases, the coordinate transformation program itself becomes more complicated, the time required for generation becomes longer, and human error increases.

To generate such coordinate transformation means, knowledge of the configuration of a memory cell and the like of a product as an object and, further, skills of generating the necessary mathematical expression and program are necessary. Therefore, engineers satisfying the conditions are limited.

Further, the propriety of the generated coordinate transformation means is verified by sampling representative points significant for verification, transmitting data of a result of coordinate transformation by the generated coordinate transformation means to a Scanning Electron Microscope (SEM) or the like, and observing an actual wafer with the human eye to see whether a stage is moved to a target position or not. The time required for verification is consequently very long and the number of sampling points for verification is limited. Therefore, time and a cost to need for generating and verification of the transformation means increase, and difficulty of improvement of the reliability increases.

SUMMARY OF THE INVENTION

A system for transforming a coordinate assigned in a semiconductor device according to an embodiment of the invention includes: a layout display unit configured to obtain an arbitrary point in layout data of the semiconductor device displayed on a screen of a display device as a coordinate value of an FBM physical coordinate system indicative of a physical position on the semiconductor device; a pattern defining unit configured to define a relationship between an FBM physical address and the FBM physical coordinates using a pattern tree obtained by combining an array pattern, defining lining direction, interval, and the number of components to be disposed at equal intervals, with a random pattern, defining the relationship between the FBM physical address as a coordinate system of FBM data indicative of an electric failure position obtained by a test process of the semiconductor device and the FBM physical coordinates in a one-to-one corresponding manner; and a forward transformation program generating unit configured to generate a forward transformation program to transform the FBM physical address of the semiconductor device into the FBM physical coordinates from the pattern defined.

A computer implemented method for transforming a coordinate in a semiconductor device according to an embodiment of the invention includes: obtaining an arbitrary point in layout data of the semiconductor device displayed on a screen of a display device as a coordinate value of an FBM physical coordinate system indicative of a physical position on the semiconductor device; defining a relationship between an FBM physical address and the FBM physical coordinates using a pattern tree obtained by combining an array pattern, defining lining direction, interval, and the number of components to be disposed at equal intervals, with a random pattern, defining the relationship between the FBM physical address as a coordinate system of FBM data indicative of an electric failure position obtained by a test process of the semiconductor device and the FBM physical coordinates in a one-to-one corresponding manner; generating a forward transformation program to transform the FBM physical address of the semiconductor device into the FBM physical coordinates from the pattern defined; and transforming the FBM physical address of the semiconductor device into the FBM physical coordinates by executing the forward transformation program.

A program for controlling a coordinate transformation system for a semiconductor device according to an embodiment of the invention includes: obtaining a position of a component to which an address in a pattern belongs and an address in a lower pattern in a pattern tree in a case where the pattern defined is an array pattern; obtaining physical coordinates in the pattern corresponding to the address in the pattern and the address in the lower pattern in the pattern tree in a case where the pattern defined is a random pattern; executing the above process on each pattern downward from the highest pattern to the lowest pattern in the pattern tree, the pattern tree obtained by combining the array pattern, defining a lining direction, interval, and the number of components disposed at equal intervals, with the random pattern, defining a relationship between an FBM physical address as a coordinate system of FBM data indicative of an electric failure position obtained by a test process of the semiconductor device and the FBM physical coordinates indicative of a physical position on the semiconductor device in a one-to-one corresponding manner; and obtaining a coordinate value finally derived as an FBM physical coordinate value corresponding to the FBM physical address value to be transformed.

BRIEF DESCRIPTION OF THE DRAWINGS

FIG. 15a shows an address system in the pattern. FIG. 15b shows physical coordinates in the pattern.

FIG. 16 shows the contents of definition of the random pattern illustrated in FIGS. 15a, 15b.

FIGS. 17a, 17b are diagrams for explaining an example of definition by an array pattern. FIG. 17a shows an address system in the pattern. FIG. 17b shows physical coordinates in the pattern.

FIG. 18 shows the contents of definition of the array pattern illustrated in FIGS. 17a, 17b.

FIG. 19 is an image diagram showing an example of a memory configuration of a semiconductor device.

FIG. 21 is an explanatory diagram showing the contents of definition of the random pattern P0 illustrated in FIG. 19.

FIG. 22 is an explanatory diagram showing the contents of definition of the array pattern P1 illustrated in FIG. 19.

FIG. 23 is an explanatory diagram showing the contents of definition of the array pattern P2 illustrated in FIG. 19.

FIG. 24 is an explanatory diagram showing the contents of definition of the array pattern P3 illustrated in FIG. 19.

FIG. 25 is an explanatory diagram showing the contents of definition of the array pattern P4 illustrated in FIG. 19.

FIG. 26 is an explanatory diagram showing the contents of definition of the array pattern P5 illustrated in FIG. 19.

FIG. 29 is an explanatory diagram showing an example of a forward transformation program for the array pattern P1 illustrated in FIG. 19.

FIG. 30 is an explanatory diagram showing an example of a forward transformation program for the array pattern P5 illustrated in FIG. 19.

FIGS. 31A and 31B are explanatory diagrams showing an example of a forward transformation program for pattern definition (random pattern P0 and array patterns P1 to P5) illustrated in FIG. 19.

FIGS. 34A and 34B are explanatory diagrams showing an example of a program of the inverse transformation program on the array pattern illustrated in FIG. 33.

FIGS. 40A and 40B are explanatory diagrams showing an example of a process routine of an array pattern in the inverse transformation program.

FIGS. 41A and 41B are explanatory diagrams showing an example of a process routine of calculating distance between defect data and a pattern in the inverse transformation program.

FIG. 42 is an explanatory diagram showing an example of a process routine of calculating distance between the defect data and a cell in the inverse transformation program.

FIG. 43 is an explanatory diagram showing an example of a process routine of returning the larger one of two numerical values.

FIG. 44 is an explanatory diagram showing an example of definition of a structure in the inverse transformation program.

FIG. 45 is an explanatory diagram showing an example of the process routine of an entry point in the inverse transformation program.

FIGS. 46A and 46B are explanatory diagrams showing an example of an inverse transformation processing routine for the array pattern P5 illustrated in FIG. 19.

FIGS. 47A and 47B are explanatory diagrams showing an example of an inverse transformation processing routine for the array pattern P4 illustrated in FIG. 19.

FIGS. 48A and 48B are explanatory diagrams showing an example of an inverse transformation processing routine for the array pattern P3 illustrated in FIG. 19.

FIGS. 49A and 49B are explanatory diagrams showing an example of an inverse transformation processing routine for the array pattern P2 illustrated in FIG. 19.

FIGS. 50A and 50B are explanatory diagrams showing an example of an inverse transformation processing routine on the array pattern P1 illustrated in FIG. 19.

FIGS. 51A and 51B are explanatory diagrams showing an example of an inverse transformation processing routine for the random pattern P0 illustrated in FIG. 19.

FIG. 52 is an explanatory diagram showing an example of calling up the inverse transformation processing routine.

DETAILED DESCRIPTION

Figure 1:
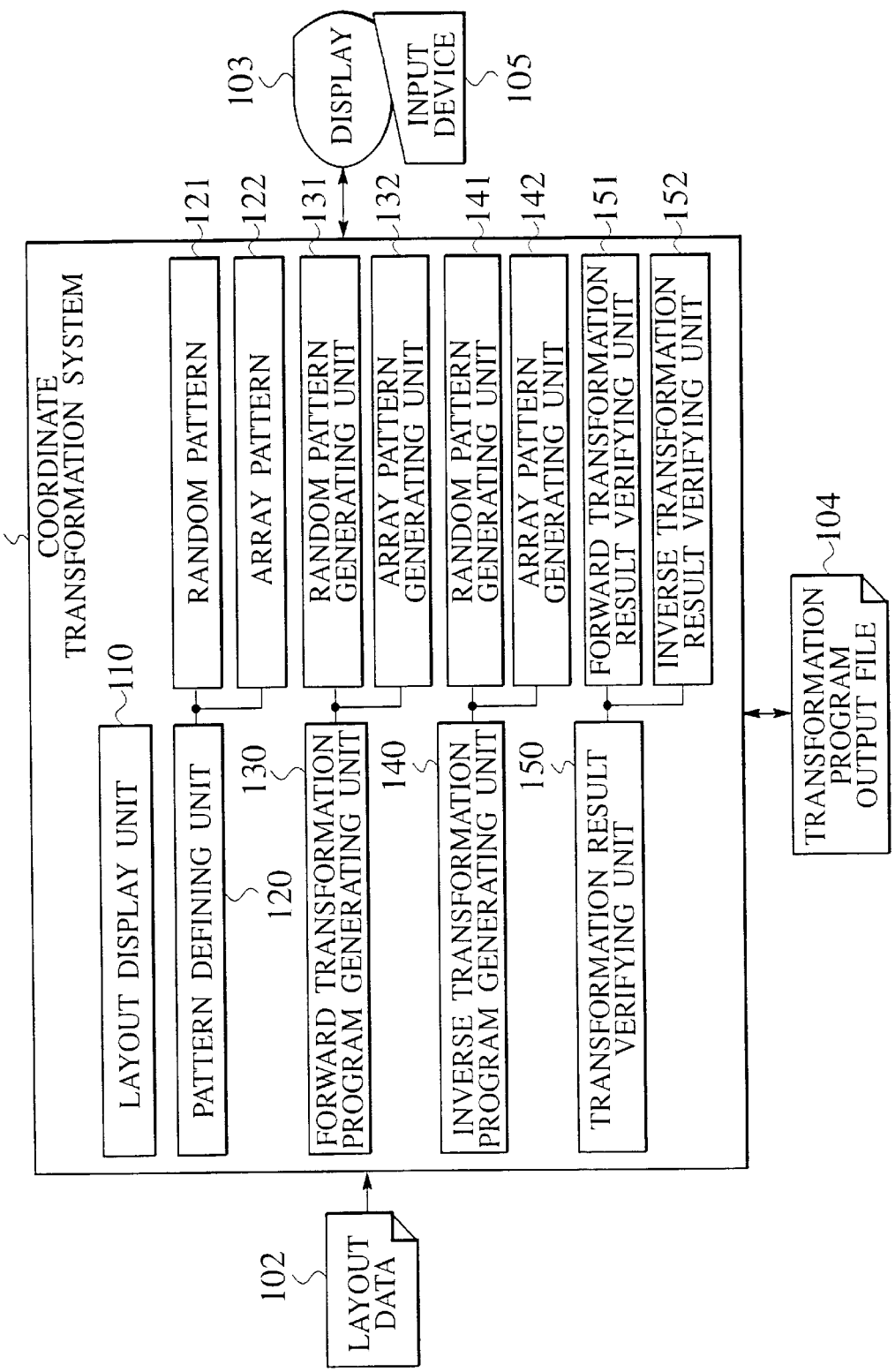
FIG. 1 is a schematic configuration diagram showing an example of a coordinate transformation system in a first embodiment.

Embodiments of the invention will be described herein below with reference to the drawings with respect to coordinate transformation of a semiconductor memory cell as an example. It is to be noted that the same or similar reference numerals are applied to the same or similar parts and elements throughout the drawings, and the description of the same or similar parts and elements will be omitted or simplified.

First Embodiment
System Configuration

FIG. 1 is a schematic configuration diagram showing an embodiment of a coordinate transformation system 101 in a semiconductor device. As shown in the drawing, the coordinate transformation system 101 reads layout data 102 as data based upon which a mask of a semiconductor product is generated; displays necessary information on a display device 103; receives necessary information from an input device 105; generates a coordinate transformation program as coordinate transformation means; and outputs the coordinate transformation program to a transformation program output file 104. The coordinate transformation system 101 is composed of, for example, a computer system such as a personal computer or workstation, and controlled by a program for realizing units which will be described later herein. The display device 103 is composed of, for example, a monitor terminal such as a VDT or liquid crystal panel, and the input device 105 is composed of a keyboard, a pointing device, or the like. The transformation program output file 104 is composed of a computer readable/writable recording medium such as information storing means such as semiconductor memory, floppy disk, hard disk, or the like, or optical reading means such as Compact Disk Read Only Memory (CD-ROM), Digital Versatile Disk (DVD), or the like. In addition, the transformation program output file 104 is composed a communication medium (such as optical fiber, radio line, or the like) in a computer network system such as Local Area Network (LAN), Wide Area Network (WAN) such as Internet, or radio communication network for propagating and supplying program information as carrier waves.

The transformation program generated in the transformation program output file 104 can be subjected to a coordinate transformation process by the coordinate transformation system 101 or distributed via a recording medium or transfer medium as described above.

The coordinate transformation system 101 includes a layout display unit 110, a pattern defining unit 120, a forward transformation program generating unit 130, an inverse transformation generating unit 140, and a transformation result verifying unit 150. The pattern defining unit 120 includes a random pattern 121 and an array pattern 122. The forward transformation program generating unit 130 includes a random pattern generating unit 131 and an array pattern generating unit 132, and the inverse transformation program generating unit 140 includes a random pattern generating unit 141 and an array pattern generating unit 142. The transformation result verifying unit 150 has a forward transformation result verifying unit 151 and an inverse transformation result verifying unit 152.

Each of the units will be described in detail herein later.
Coordinate Systems

Coordinate systems used in the coordinate transformation system 101 will be defined first. In the coordinate transformation system 101, the following four types of coordinate systems are used.

Figure 2:
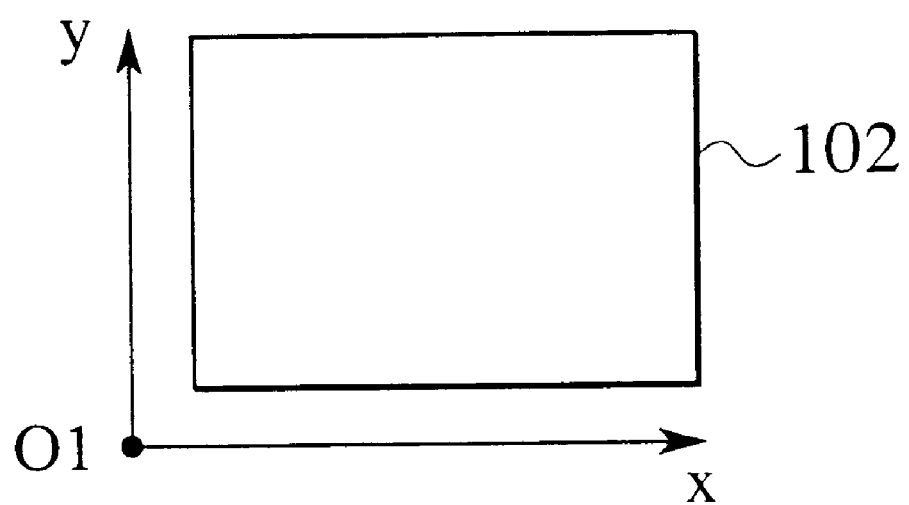
FIG. 2 is a diagram for explaining a coordinate system in layout data.

(1) layout coordinate system
(2) FBM physical address system
(3) FBM physical coordinate system
(4) defect data physical coordinate system The layout coordinate system is, as shown in FIG. 2, a coordinate system in the layout data 102, which a rectangular coordinate system having an arbitrary point as an origin 01. The unit of the coordinate value is not limited and an arbitrary unit can be employed. The layout data 102 is data based upon which a mask pattern used for manufacturing a semiconductor product is formed, and is basically similar to the shape of a circuit pattern of wiring or the like conducted on a semiconductor wafer. Therefore, for example, when distance between two points on the layout data and distance between two corresponding points on a wafer are known, the scale ratio can be obtained. From the distance between other two points on the layout data 102, actual distance between two corresponding points on the wafer can be calculated.

The FBM physical address system is a coordinate system in which FBM data indicative of the position of an electric failure in a semiconductor chip obtained in a test process in the manufacturing process of the semiconductor device is rearranged in a two-dimensional lattice so as to be similar to an arrangement of actual memory cells, and logic numbers (addresses) are assigned. The FBM physical address system indicates relative positional relations of front, rear, right and left but does not include information of physical arrangement, distances, and the like.

Figure 3:
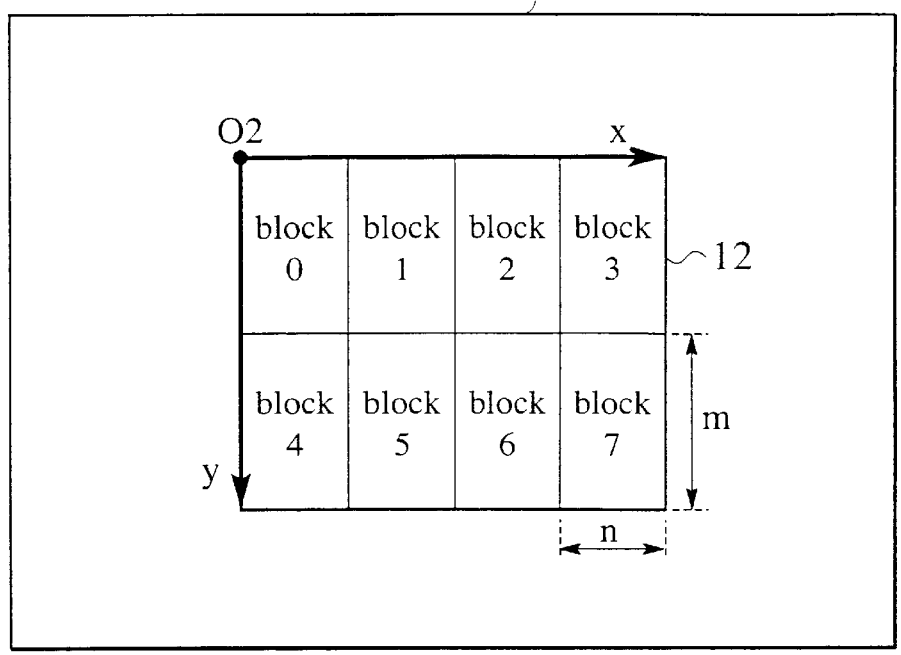
FIG. 3 is a diagram for explaining an FBM physical address coordinate system.

FIG. 3 shows an example of the FBM physical address system defined in the coordinate transformation system 101. For example, the left upper corner of a memory area 12 formed on a chip 11 is defined as an origin 02, the right direction is defined as X, and the downward direction is defined as Y. In the example shown in the diagram, the memory area 12 is constructed by collection of units called blocks (block 0 to block 7) each obtained by collecting a plurality of cells in a rectangular area. The size of a block is expressed in a two-dimensions of n×m. The sizes of the blocks (block 0 to block 7) are equal to each other. The block number starts from "0", increments one by one in the X direction to the right end, and increments by one in the Y direction.

Figure 4:
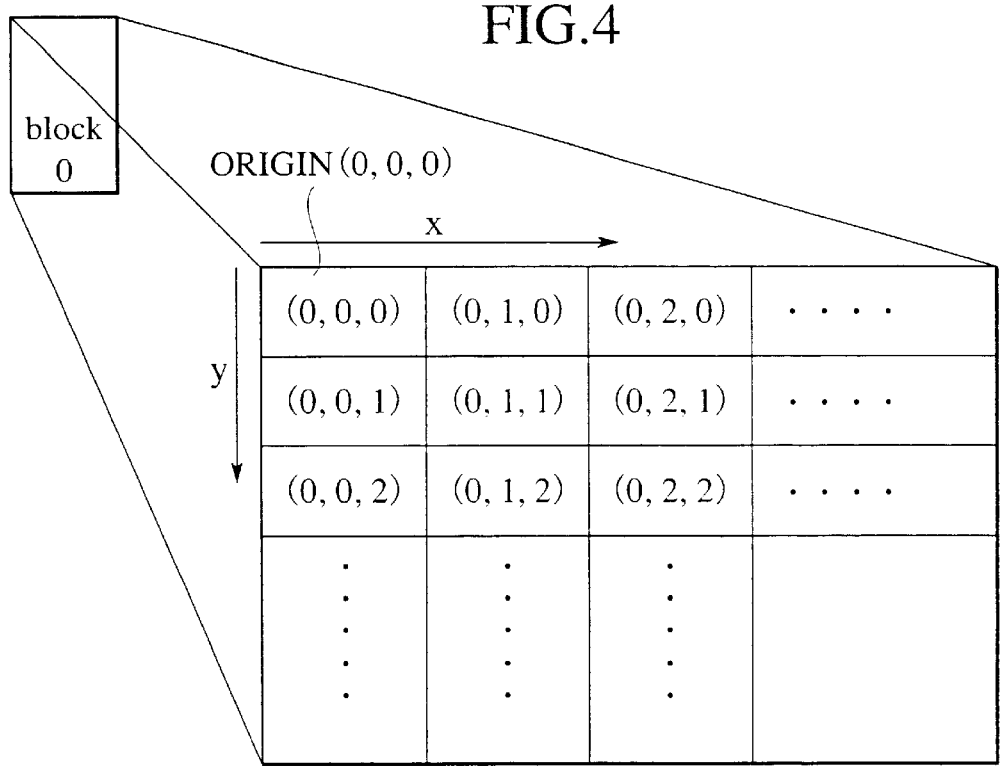
FIG. 4 is a diagram for explaining an address in a block in the FBM physical address coordinate system.

FIG. 4 illustrates a coordinate system in one block (block 0) in the FBM physical address system shown in FIG. 3. One block includes a plurality of cells formed in a two-dimensional lattice using the cell (0,0,0) at the left upper corner as the origin. An FBM physical address is expressed as an address (block number, X, Y) assigned to the cell.

Figure 5:
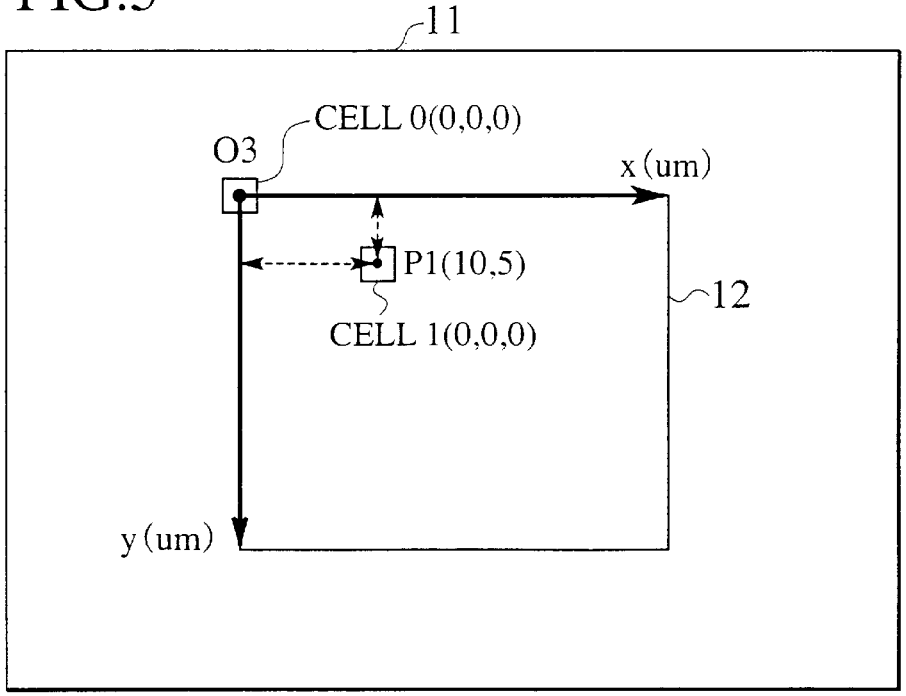
FIG. 5 is a diagram for explaining an FBM physical coordinate system.

The FBM physical coordinate system is a rectangular physical coordinate system expressing the physical position of a representative point (such as a trench) of each memory cell. In the FBM physical coordinate system, as illustrated in FIG. 5, the block 0 ((block number, X, Y)=(0,0,0)) in the FBM physical address system is set as the origin O3, the right direction is set as X, the downward direction is set as Y, and the unit of scale is defined as $\mu$m. In the FBM physical coordinate system, a coordinate value from the origin O3 of the FBM physical coordinate system on an actual wafer to the representative point of each memory cell is shown. In the example shown in FIG. 5, the coordinate values of a cell 0 whose representative point is the origin O3 and a cell 1 whose representative point is P1 are expressed as shown in Table 1.

TABLE 1

| representative point | FBM physical address coordinate system (block number, X, Y) | FBM physical coordinate system (X, Y) |
|---|---|---|
| O3 | (0, 0, 0) | (0, 0) |
| P1 | (0, 1, 0) | (10, 5) |

Figure 6:
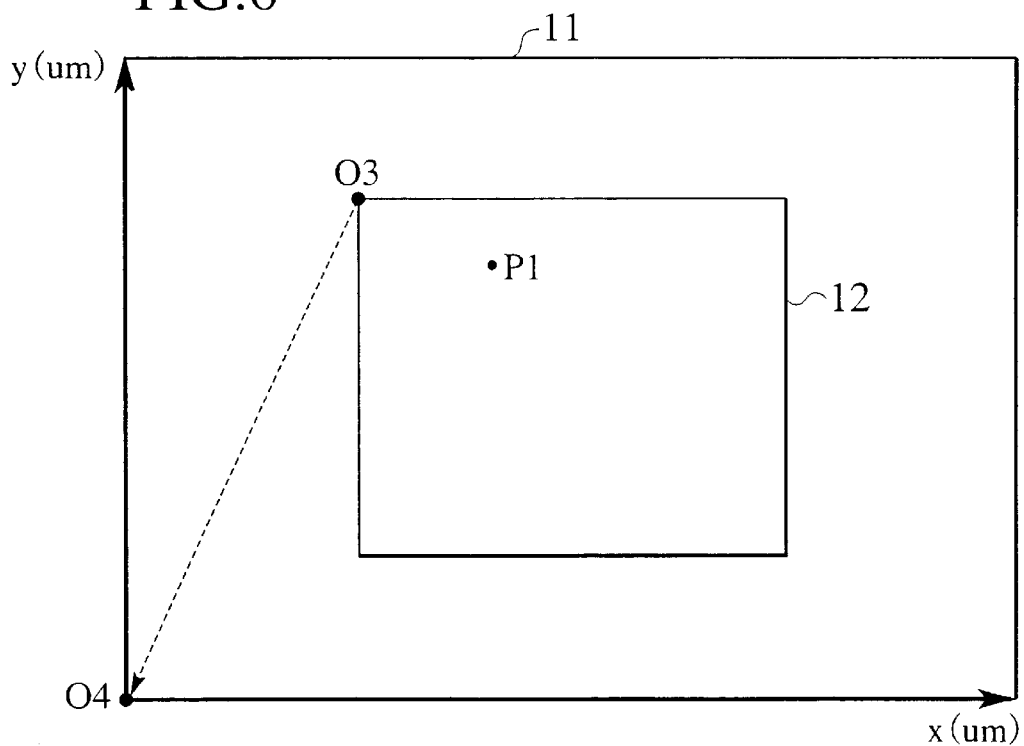
FIG. 6 is a diagram for explaining a defect data coordinate system.

The defect data coordinate system is, as illustrated in FIG. 6, a coordinate system obtained by moving the origin O3 of the FBM physical coordinate system to an origin O4 at the left lower corner of the chip 11. In the coordinate transformation system 101, coordinate transformation is made so that the FBM physical address system finally coincides with the defect data coordinate system.

Layout Display Unit

The layout display unit 110 will now be described in detail.

Figure 8:
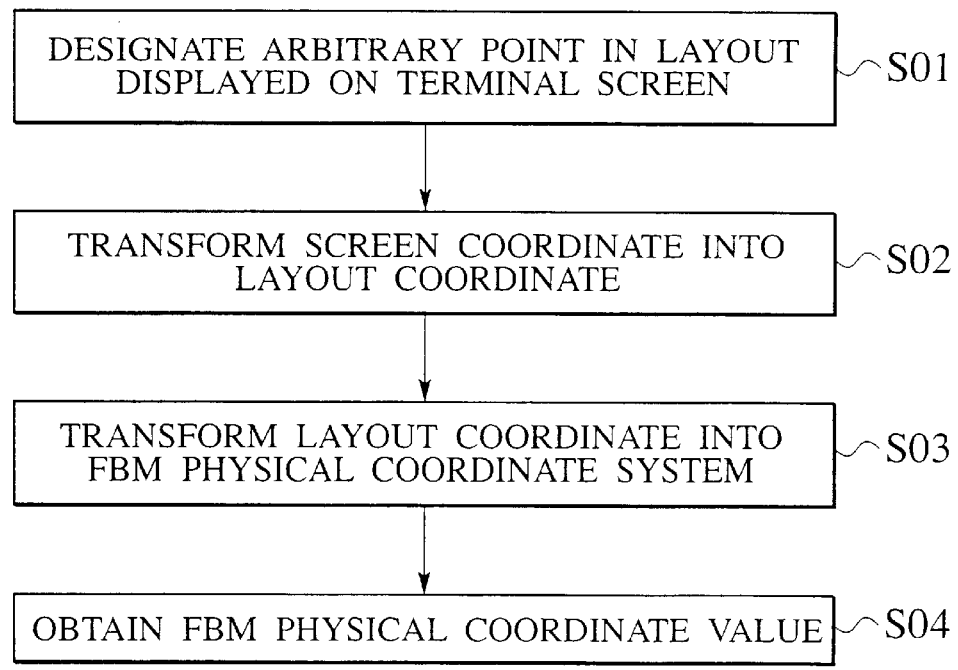
FIG. 8 is a flowchart showing an example of the procedure of a layout display unit in the coordinate transformation system.

In the coordinate transformation system 101, to generate a transformation program used for coordinate transformation, the relationship between the layout of a memory cell and the FBM physical coordinate has to be defined. In the coordinate transformation system 101, the FBM physical coordinate value of a memory cell is obtained from the layout data 102. The procedure is shown in a flowchart of FIG. 8.

First, the coordinate transformation system 101 reads the layout data 102 of the semiconductor product as an object, transforms the coordinate system of the read layout data 102 into a screen coordinate system, and displays the layout on the screen of the display device 103.

The user of the coordinate transformation system 101 designates an arbitrary point in the layout displayed on the screen by using the pointing device or the like of the input device 105 in step S01. The coordinate transformation system 101 obtains the coordinate value in the layout coordinate system with respect to the point designated by the user with the pointing device or the like in step S02.

Subsequently, the user enters the scale ratio between the layout coordinate system and the FBM physical coordinate system from the input device 105. The scale ratio denotes the ratio between the size of an object in the layout formed on the screen and the size of an object on an actual wafer and is defined by the following formula. In the following formula, Sr is the scale ratio, L1 is length in the layout coordinate system, and F1 is length in the FBM physical coordinate system.

$$Sr=L1/F1 \tag{1}$$

Figure 7:
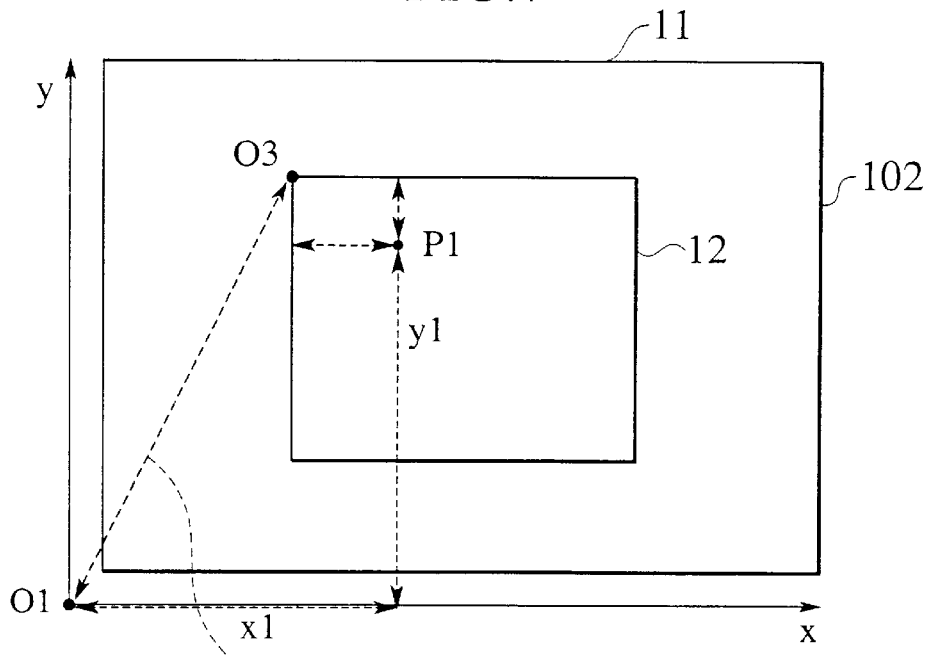
FIG. 7 is a diagram for explaining mapping of the FBM physical coordinate system to a layout coordinate system.

As shown in FIG. 7, the user designates the origin O3 of the FBM physical coordinate system in the layout formed on the screen using the pointing device or the like. The coordinate transformation system 101 can thereby obtain relative coordinates of the origin O1 of the layout coordinate system and the origin O3 of the FBM physical coordinate system, and can map the layout coordinate system into the FBM physical coordinate system or map the FBM physical coordinate system into the layout coordinate system in step S03. At this time, the notch direction of the layout coordinate system and that of the FBM physical coordinate system are aligned. If the notch directions differ from each other, they are turned so that the notch directions are aligned.

On the basis of the scale ratio and the relative coordinates of the origin O1 of the layout coordinate system and the origin O3 of the FBM physical coordinate system, the coordinate transformation system 101 can obtain, as the coordinate values of the FBM physical coordinate system, the coordinate values in an arbitrary point in the layout displayed on the screen in step S04. In the example shown in FIG. 7, the coordinate values (x1,y1) of the point P1 in the layout coordinate system having the point O1 as the origin.

Pattern Defining Unit

The pattern defining unit 120 will now be described in detail.

In the coordinate transformation system 101, the relationship between the FBM physical address of a memory cell and the FBM physical coordinates (herein below, called "memory cell configuration") is expressed by two kinds of patterns, a random pattern and an array pattern.

In the random pattern, the relationship between the FBM physical address of a component (cell or already generated pattern) disposed in the pattern and the FBM physical coordinates is defined in a one-to-one corresponding manner. In the array pattern, the direction, interval, and the number of components (cells or already generated pattern) disposed in the pattern which are arranged at the equal intervals are defined.

Figure 9:
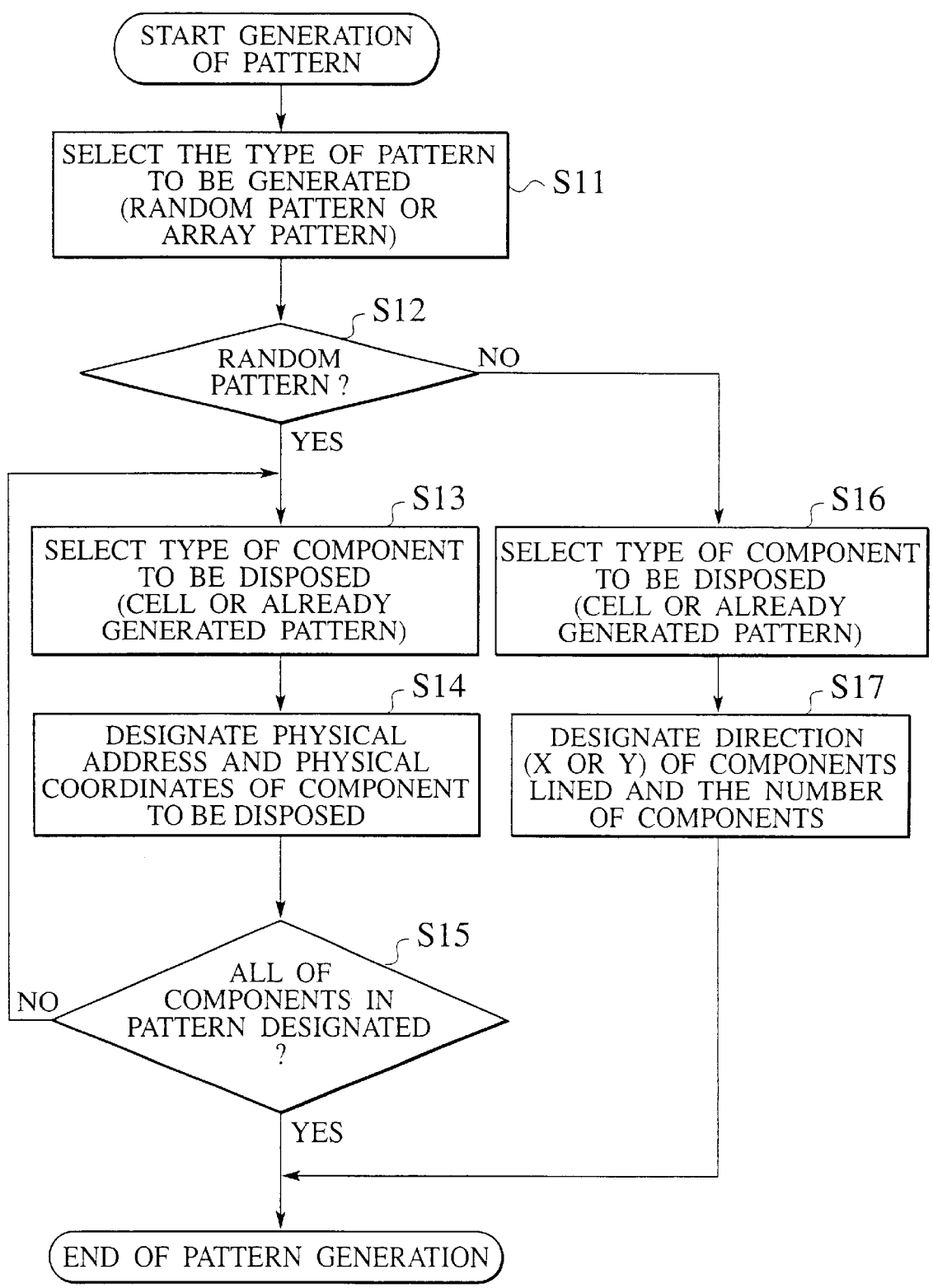
FIG. 9 is a flowchart showing an example of the procedure of a pattern defining unit in the coordinate transformation system.

FIG. 9 is a flowchart showing an example of the procedure of defining a pattern.

First, the user selects the type of a pattern (random pattern or array pattern) to be generated from the input device 105 in step S11.

In the case of selecting the random pattern in step S12, the user selects a component (cell or already generated pattern) disposed in the random pattern in step S13 and designates the FBM physical address value and the physical coordinate value of the component disposed in step S14. Until the FBM physical address value and the physical coordinate value are designated with respect to all of the components in the pattern, Steps S13 and S14 are repeated in step S15.

On the other hand, in the case of selecting the array pattern in step S12, the user selects a component (cell or already generated pattern) to be disposed in the array pattern in step S16 and designates the direction of components lined (X or Y direction), the interval, and the number of components in step S17.

The coordinate transformation system 101 defines the memory configuration by the random pattern and the array pattern generated by the above process.

Subsequently, each of the random pattern and the array pattern will be described in detail.

The random pattern is a pattern in which the correspondence between the FBM physical address of the component (cell or already generated pattern) of the pattern and the FBM physical coordinates is defined in a one-to-one manner, so that a memory cell in any position can be expressed.

Figure 10:
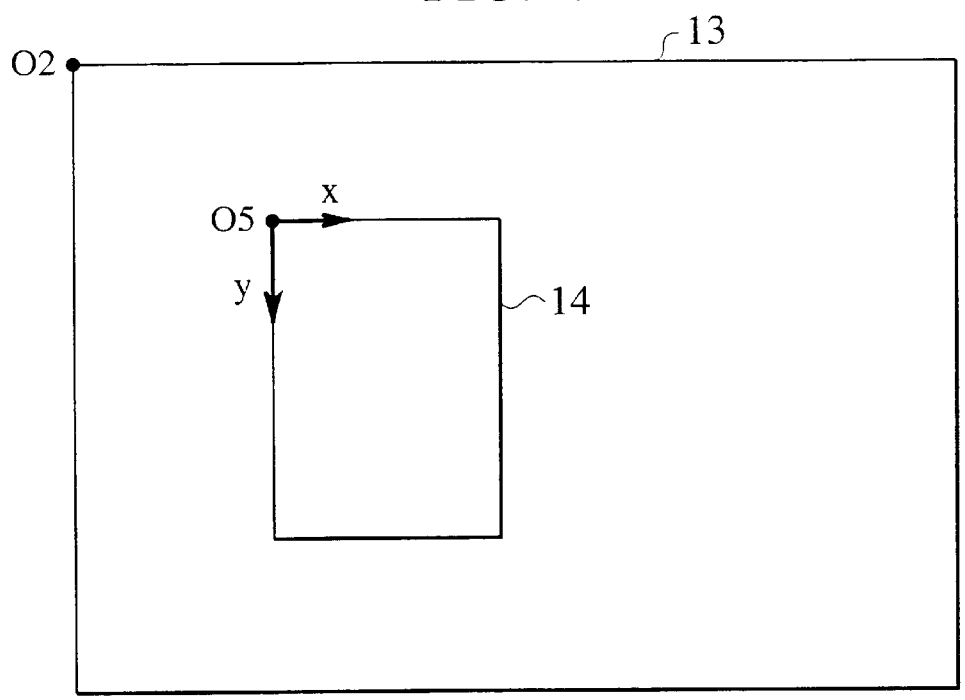
FIG. 10 is a diagram for explaining an address in a pattern in the FBM physical address system.

A random pattern is generated usually in a local range. As shown in FIG. 10, a coordinate system translated so that the memory cell at the left upper corner in an area 14 defined as a random pattern becomes the origin O2 of the FBM physical address is set. By using the point O5 as an origin, the physical address system in the pattern is defined.

When the components of the random pattern include a pattern defined as a block, the number of the block having the smallest block number in the blocks in the pattern is re-assigned as "0" and is defined as an address in the pattern.

Figure 11:
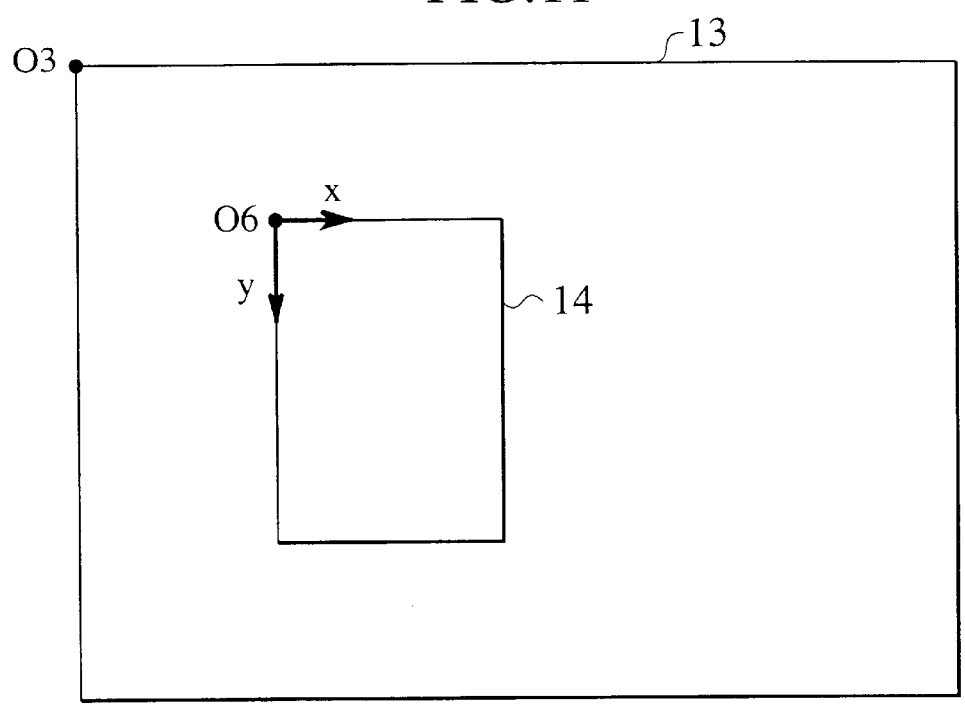
FIG. 11 is a diagram for explaining a physical coordinate in a pattern in the FBM physical coordinate system.

Similarly, as shown in FIG. 11, a coordinate system which is translated so that a memory cell at the left upper corner in the area 14 defined as a random pattern becomes the origin O3 of the FBM physical coordinate system is set, and a physical coordinate system in a pattern is defined by using the point 06 as an origin.

At the time of generating a random pattern, the user enters the following information from the input device 105.

(1) the name of the random pattern to be generated
(2) the relationship of the address value in the pattern and the physical coordinate value in the pattern with respect to each of the components of the random pattern (cells or already generated patterns).
(3) the type of the component (cell or already generated pattern).

The coordinate transformation system 101 calculates the number of components (the number of components in the X direction and the number of components in the Y direction) constructing the random pattern generated. The number of components is the number of memory cells in a case where the component is a memory cell. When a pattern defined as a block is included in the components, the number of components is the number of blocks.

When the components of the random pattern are constructed by patterns, the coordinate transformation system 101 records the start point and the end point of the pattern outer frame of each component. An outer frame 14 of the random pattern is a rectangular frame enclosing the components in the pattern. The start point S1 denotes the point at the left upper corner of the outer frame 14, and the endpoint E1 denotes the point at the right lower corner of the outer frame 14.

Figure 12:
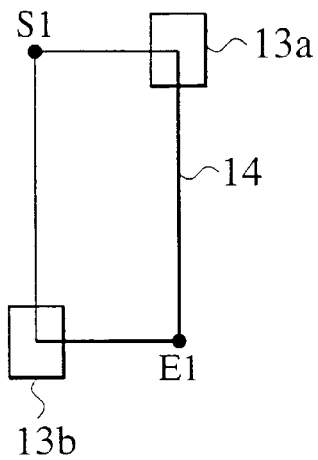
FIG. 12 is a diagram for explaining a start point and an end point of an outer frame of a pattern in a case where components constructing a pattern are cells only.

For example, as shown in FIG. 12, in a case where all the components of the random pattern A are cells, the outer frame 14 of the random pattern A is the rectangular frame enclosing all of cells 13a and 13b. Although each of the memory cells 13a and 13b are enlarged shown for convenience, in reality they are points, which are not large.

Figure 13:
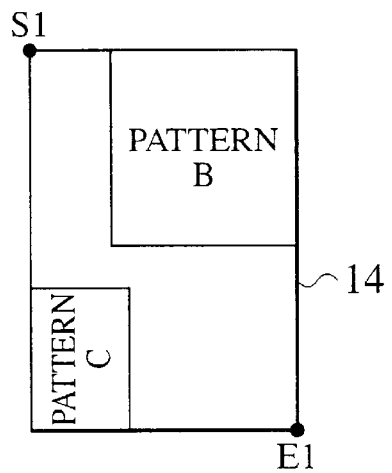
FIG. 13 is a diagram for explaining a start point and an end point of an outer frame of a pattern in a case where components of the pattern are defined patterns only.
Figure 14:
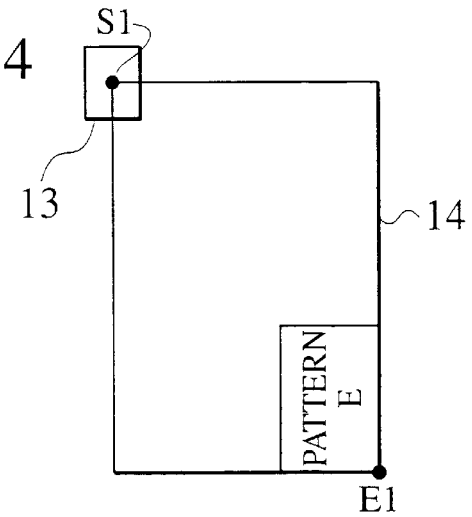
FIG. 14 is a diagram for explaining a start point and an end point of an outer frame of a pattern in a case where components of the pattern are both defined-patterns and cells.

When all of the components of the random pattern D are patterns as shown in FIG. 13, the outer frame 14 of the random pattern D is the rectangular frame enclosing all the patterns B and C. Further, when the components of the random pattern F are constructed by cells and patterns as shown in FIG. 14, the outer frame 14 of the random pattern F is the rectangular frame enclosing all the cells 13 and patterns E.

The coordinate transformation system 101 also records coordinate values of the start point S1 and end point E1 of the defined random pattern. The coordinate values are required to generate a new pattern using the defined pattern.

Figure 15B:
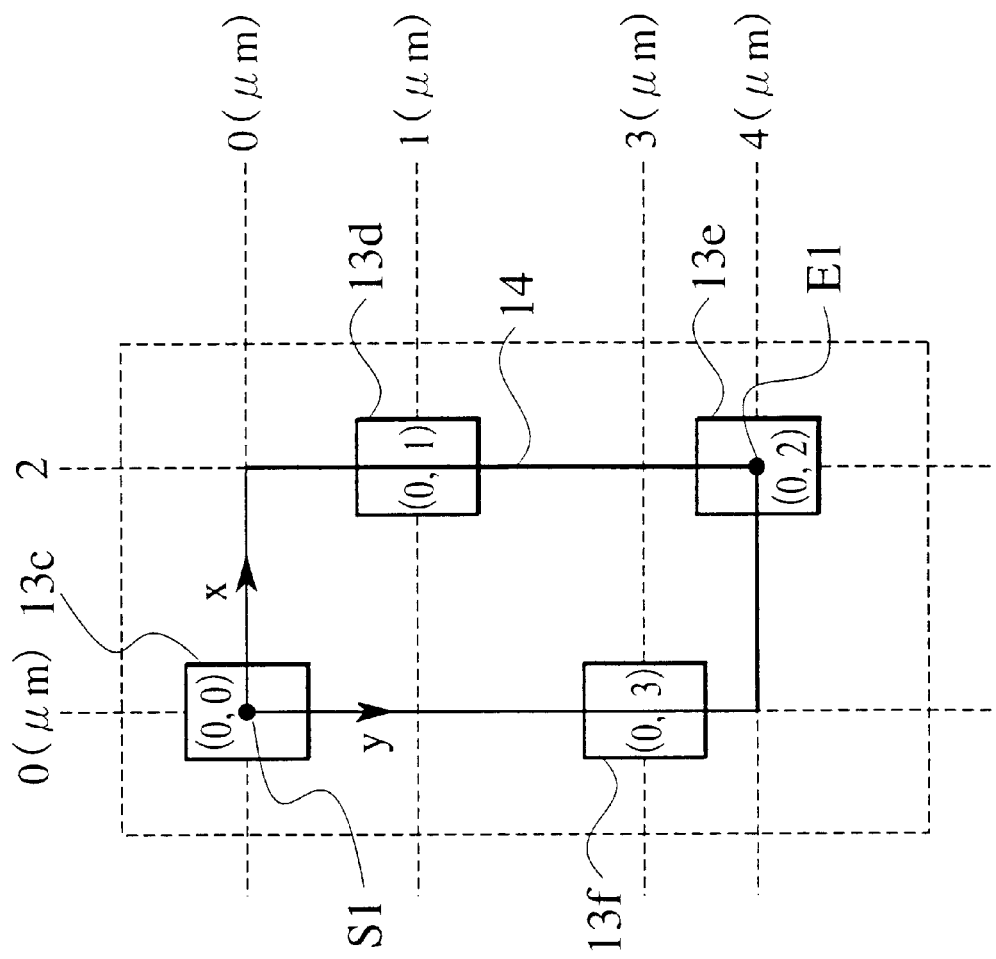
FIGS. 15a, 15b are diagrams for explaining an example of definition by a random pattern.
Figure 15A:
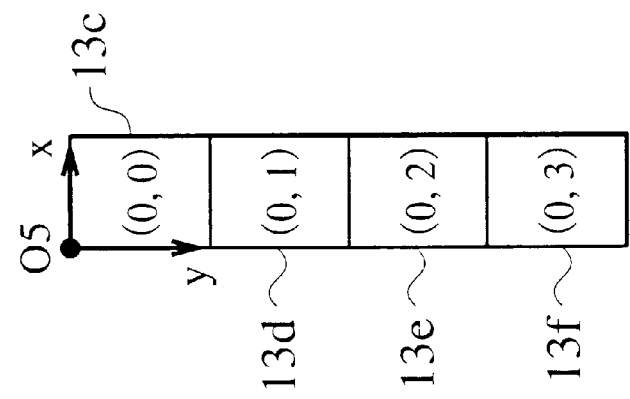

FIG. 16 illustrates an example of defining the memory cell configuration that includes a physical address system in the pattern as shown in FIG. 15A and a physical coordinate in the pattern in FIG. 15B by the random pattern P0. The random pattern P0 is constructed by four memory cells 13c to 13f as components. For each of the cells, the address value in the pattern, the physical coordinate values in the pattern, and the type of the component are set. Since the component is a memory cell, the initial value is set in each of items of the number of cells (or the number of blocks) in the component, and the start and end points of the outer frame of the pattern of the components. The physical coordinate values in the pattern having the start point S1 and the end point E1 of the outer frame 14 of the pattern P0 are also set.

The array pattern will now be described in detail.

The array pattern is a pattern using arrangement such that the components (cells or already generated patterns) of the array pattern are the same and arranged in the X or Y direction at equal intervals. In the case of generating an array pattern, the user enters the following information.

(1) the name of the array pattern
(2) the lining direction of components constructing the array pattern
(3) the type of the component (cell or already generated pattern)
(4) the number of repetition of the component
(5) the arrangement interval For the arrangement interval, the user may directly enter a numerical value. By designating two components on a layout with the pointing device, the coordinate transformation system 101 can calculate the arrangement interval from the coordinate values of the two points.

When the components of an array pattern are patterns, the coordinate transformation system 101 records relative coordinate values of the start and end points of the outer frame of the pattern of each component.

The coordinate transformation system 101 also records the coordinate values of the start point S1 and end point E1 of the outer frame 14 of the defined array pattern. The coordinate values are required to generate a new pattern using the defined pattern.

FIG. 18 illustrates an example of defining the memory cell configuration that includes a physical address system in the pattern as shown in FIG. 17A and physical coordinates in the pattern as shown in FIG. 17B by the array pattern P1. The array pattern P1 is constructed by four memory cells 13g to 13j as components. With respect to the cells 13g to 13j, the lining direction, interval ($\mu$m), the number of repetition times, the type of the component, the physical coordinate values in the pattern of the start point S1 and the end point E1 of the outer frame 14 of the pattern 0, and the like are set. Since the components are memory cells, initial values are set for the items of the number of cells (or blocks) in the components, and the start and end points of the pattern outer frame of the components.

Figure 20:
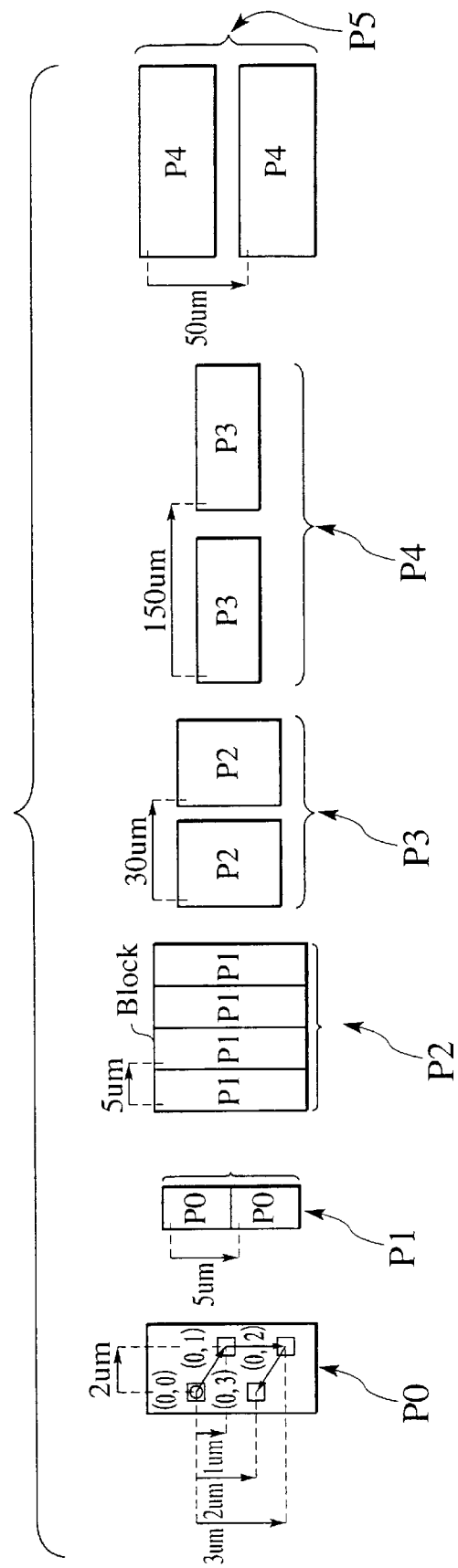
FIG. 20 is an image diagram showing an example where the memory configuration of the semiconductor device illustrated in FIG. 19 is defined by a random pattern P0 and array patterns P1 to P5.

FIG. 20 shows an example of defining the memory cell configuration shown in FIG. 19 by a combination of the random pattern and array patterns. Although memory cells are not shown in FIG. 19, it is assumed that, 32 memory cells each, (0,0) to (3,7) are arranged in each of blocks 0 to 7, and total 256 memory cells are arranged in reality.

In the example shown in FIG. 20, first, the upper left four memory cells (0,0), (0,1), (0,2), and (0,3) of Block 0 are defined as a random pattern P0 (refer to FIG. 21).

Next, by arranging two random patterns P0 already defined in the Y direction, the left eight memory cells (0,0) to (0,7) in the block 0 are defined as an array pattern P1 (refer to FIG. 22).

By arranging four array patterns P1 already defined in the X direction, the 32 memory cells in the whole block 0 are defined as an array pattern P2 (refer to FIG. 23).

By arranging two array patterns P2 in the X direction, the blocks 0 and 1 are defined as an array pattern P3 (refer to FIG. 24).

Further, by arranging two array patterns P3 in the X direction, the blocks 0 to 3 are defined as an array pattern P4 (refer to FIG. 25).

Finally, by arranging two array patterns P4 in the Y direction, the blocks 0 to 7 are defined as an array pattern P5 (refer to FIG. 26).

The result of the memory cell configuration defined by combinations of patterns in such a manner is called a "pattern tree". The pattern tree can efficiently express the whole memory by hierarchically building up patterns each defining a local part.

In the pattern tree, a pattern expressing the whole memory (pattern P5 in the example shown in FIG. 20) is called a "root". In the pattern tree, the root is used as the highest pattern, elements constructing the lowest pattern (pattern P0 in the example shown in FIG. 20) are always cells. The pattern at the end is called "lowest end".

Definition and combination of the random and array patterns are not limited to the example but can be variously considered. At the time of generating a pattern, the following matters require attention.

(1) Although the memory cell configuration can be defined only by a combination of random patterns, as the number of memory cells increases, the number of patterns to be defined becomes enormous. Consequently, the trouble of generation can be lessened by properly combining array patterns.

(2) A random pattern including a pattern having a single block or a plurality of blocks as components and a pattern having a single cell or a plurality of cells as components cannot be generated.

(3) A random or array pattern to be generated has to have a rectangular shape in the FBM physical address system.

(4) A component of the random pattern can be defined by either a configuration of a plurality of memory cells, a configuration of a single memory cell or a plurality of memory cells and a single pattern or a plurality of patterns, or a configuration by a plurality of patterns.

(5) At the time of generating a pattern including blocks, the block numbers in the pattern have to be in sequence.

(6) Cells in different blocks cannot be defined in a pattern.

(7) One block has to be defined as a pattern in a portion from the root of the pattern tree to each lower end.

Forward Transformation Program Generating Unit

The forward transformation program generating unit 130 will now be described in detail.

On the basis of a pattern tree defined by the random pattern, array pattern, or a combination of the random and array patterns, a transformation program for transforming the FBM physical address system to the FBM physical coordinate system is generated. In the specification, transformation from the FBM physical address system to the FBM physical coordinate system is called "forward transformation", and an example of generating a program of the forward transformation program using Visual Basic language of Microsoft Corporation in U.S.A. will be described here.

Figure 27:
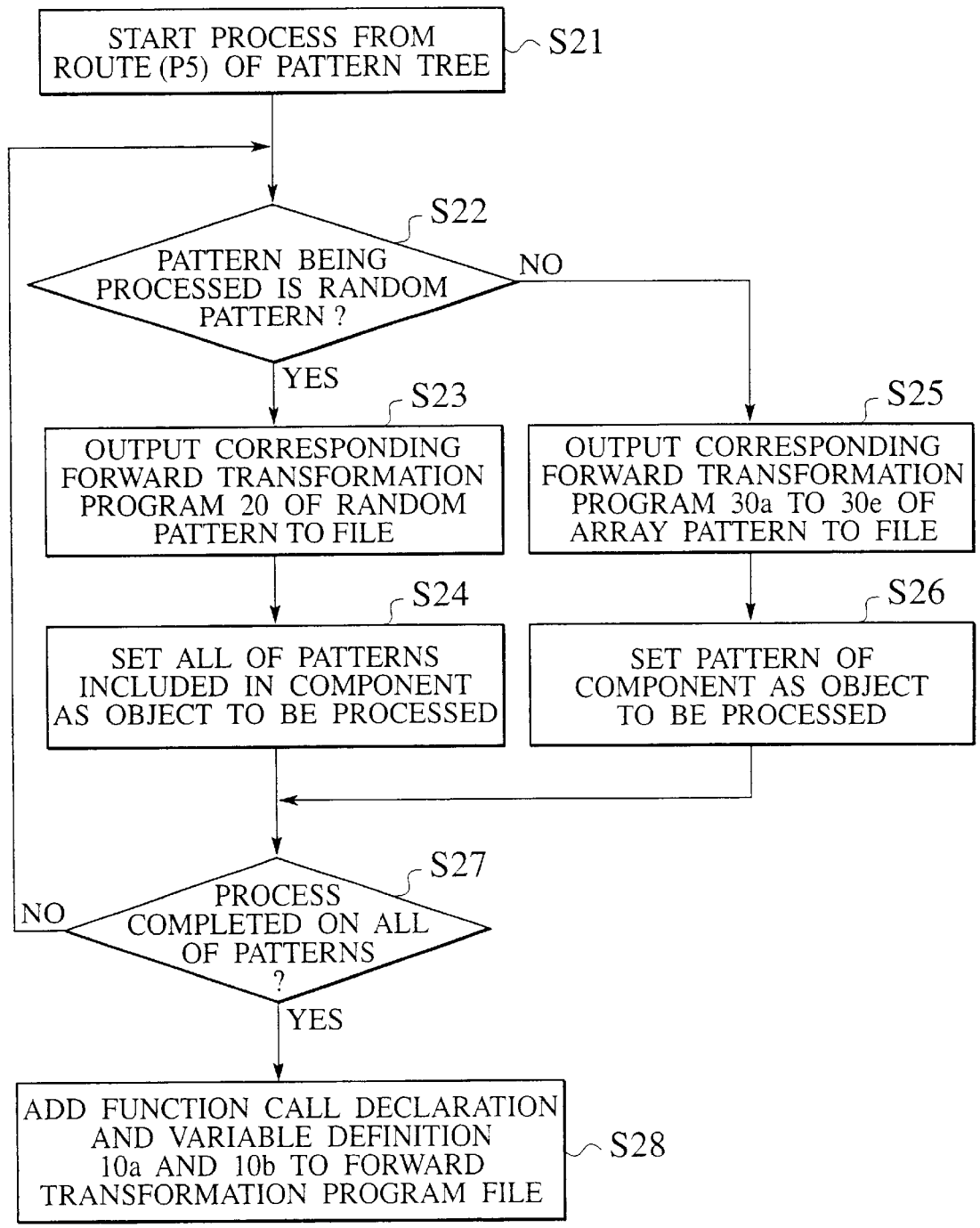
FIG. 27 is a flowchart showing an example of the procedure of a forward transformation program generating unit in the coordinate transformation system.
Figure 28:
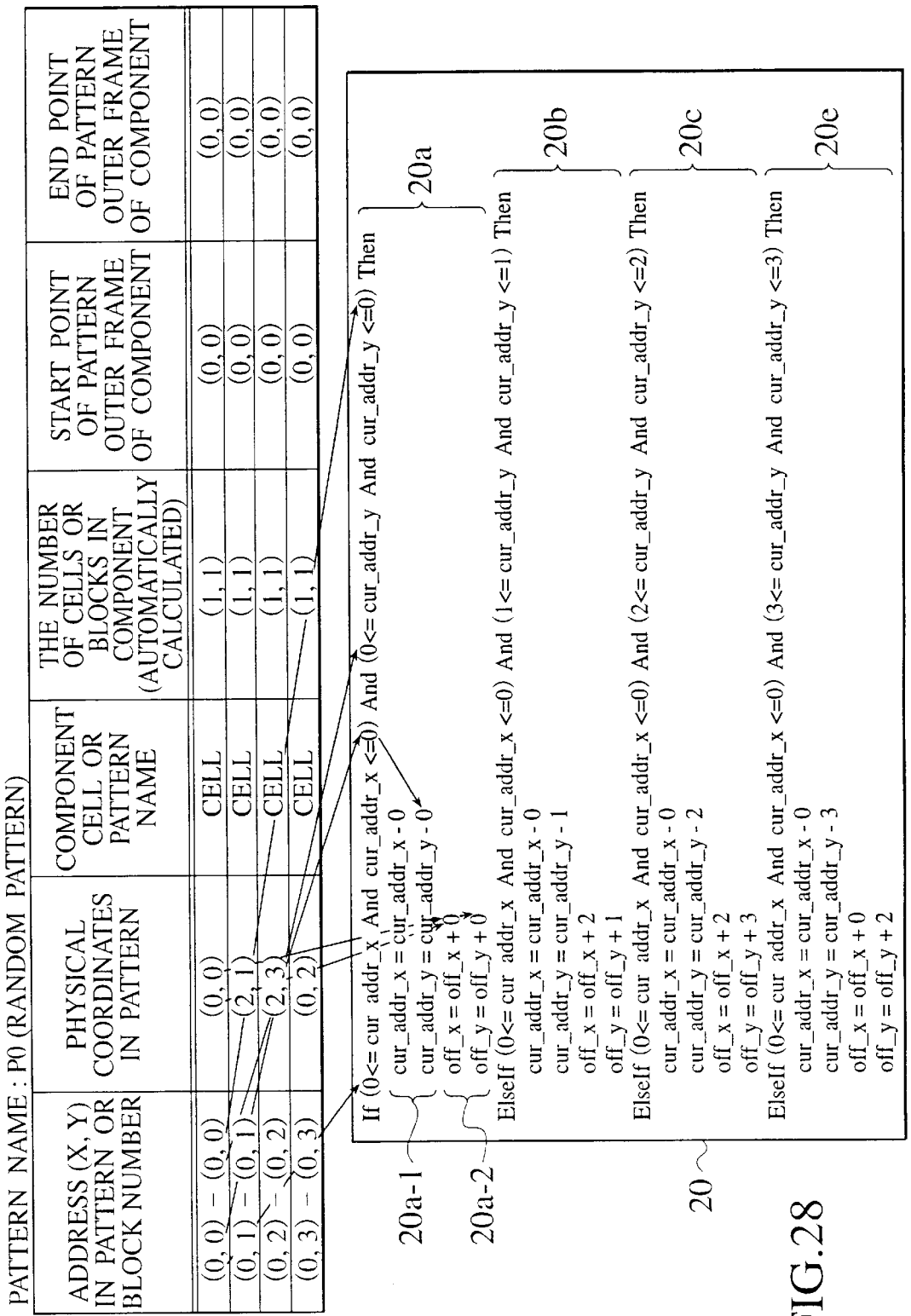
FIG. 28 is an explanatory diagram showing an example of a forward transformation program for the random pattern P0 illustrated in FIG. 19.

FIG. 27 is a flowchart showing the procedure of the coordinate transformation system 101 for generating the forward transformation program. According to the processes of the flowchart, an example of generating the transformation program on the basis of the pattern tree (patterns P0 to P5) shown in FIG. 20 will be described.

The coordinate transformation system 101 starts processing from the root (pattern P5) of the pattern tree in step S21.

First, whether the type of the pattern being processed is a random pattern or array pattern is determined in step S22. In this case, the pattern P5 is an array pattern, so that the coordinate transformation system 101 generates a forward transformation program 30e adapted to an array pattern and outputs it to the transformation program output file 104 in step S25.

FIG. 30 shows an example of the forward transformation program 30e for the array pattern P5.

The forward transformation program 30e is constructed by:

(1) a process of obtaining the position of the component (cell or already generated pattern) in which the address in the pattern exists, and calculating distance (off_y) to the component (30e_1); and (2) a process of calculating a physical address (cur_block) in a pattern lower than the pattern by one (in this case, array pattern P4) (30e_2).

In the process (1), if the block number of the FBM physical address designated by the user is "4" or larger (blocks 4 to 7), the interval value of "50 ($\mu$m)" is added to the distance (off_y) to the component. On the contrary, if the block number is smaller than "4" (blocks 0 to 3), the interval value is not added. That is, the distance to the component can be acquired by demanding the position of the address in the pattern in the blocks 4 to 7 or the blocks 0 to 3.

In the process (2), the address value in a pattern which is lower than the pattern by one can be calculated. That is, the position of the address in the blocks 0 to 3 or blocks 4 to 7 can be acquired.

For example, when it is assumed that the block number of the FBM physical address value designated by the user is "6", off_y=50 is derived as a result of the process (1), and cur_block=2 is obtained as a result of the process (2).

"Int" denotes a function of rounding down, and "Mod" denotes a function of remainder.

Referring again to the flowchart of FIG. 27, the pattern of the component is used as an object to be processed in step S26.

The coordinate transformation system 101 determines whether or not the process is completed with respect to all of the patterns in step S27 and, if not, returns again to step S22. If yes, the coordinate transformation system 101 advances to step S28.

If there is still a pattern to be processed, the coordinate transformation system 101 returns back to step S22.

Subsequently, in a manner similar to the case of the array pattern P5, the coordinate transformation system 101 repeats the processes of steps S25 and S26 with respect to the array patterns P4, P3, P2, and P1.

FIG. 29 is a diagram showing an example of the forward transformation program 30a for the array pattern P1. The forward transformation program 30a is similarly constructed by:

(1) a process of obtaining the position of the component in which the address in the pattern exists, and calculating distance (off_y) to the component (30a_1); and (2) a process of calculating a physical address (cur_addr_y) in a pattern lower than the pattern by one (in this case, random pattern P0) (30a_2).

The difference the case of the forward transformation program 30e is that the value calculated in the process (2) is the address value (cur_addr_y) in the Y direction of the physical address in the pattern.

In the array patterns P5 and P0, the process is performed in the array patterns lined in the Y direction, so that the value calculated in the process (1) is the value (off_y) in the Y direction. However, at the time of processing array patterns lined in the X direction like the array patterns P4, P3, and P2, the value (off_x) in the X direction is obtained.

Returning back to step S22, the coordinate transformation system 101 generates a forward transformation program 30e for the random pattern P0, and outputs it to the transformation program output file 104 in step S23.

FIG. 30 shows an example of the forward transformation program 20e for the random pattern P0.

The forward transformation program 30e is constructed by:

(1) a process of calculating the physical address (cur_addr_x, cur_addr_y) in a pattern lower by one (20a_1); and (2) a process of calculating physical coordinate values (off_x, off_y) in the pattern (20a_2).

Each of the processes (1) and (2) is performed on each of the components of the pattern P0. For example, in the case of the components of the address "(0,0)—(0,0)" in the pattern, the process 20a is applied. In the case of the components of the address "(0,3)—(0,3)" in the pattern, the process 20e is applied.

Since the random pattern P0 is the pattern at the lower end, the result of the process (1) is not used after that but is prepared as a process for a case where a lower pattern exists. In the case where the component of the lower pattern is defined as a block, the value obtained in the process (1) is cur_block.

The process on all of the patterns constructing the pattern tree is completed in step S27. Finally, call declaration, variable definition 10a and 10b, and the like are added to the transformation program output file 104 to thereby complete, as shown in FIGS. 31A and 31B, a program as forward transformation program in step S28.

Variables as inputs and outputs of the forward transformation program shown in FIG. 31A are as follows.

(1) fbmno: block number of a physical address <input>

(2) FBM_X: X address of a physical address <input>

(3) FBM_Y: Y address of a physical address <input>

(4) fbm_phys_x: transformed physical coordinate value X <output>

(5) fbm_phys_y: transformed physical coordinate value Y <output>

The physical coordinate values (off_x off_y) in the pattern obtained in the pattern P0 are finally substituted for the physical coordinate values (fbm_phy_x, fbm_phy_y).

Inverse Transformation Program Generating Unit

The inverse transformation program generating unit 140 will now be described in detail.

The coordinate transformation system 101 generates a transformation program for transforming the physical coordinate system to the FBM physical address system by a pattern tree constructed by the random and array patterns defining the memory cell configuration. In the specification, coordinate transformation from the physical coordinate system to the FBM physical address system is called "inverse transformation". An example of generating a program of the inverse transformation program using Visual Basic language of Microsoft Corporation in U.S.A. will be described here.

Inverse Transformation Program in the Case of Array Pattern

First, an inverse transformation program for an array pattern will be described in detail.

An array pattern is expressed by the same components (cells or already generated patterns) lined at predetermined intervals in the same direction. A component (cell or already generated pattern) closest to the position of defect data expressed in the physical coordinate system is obtained.

Figure 32:
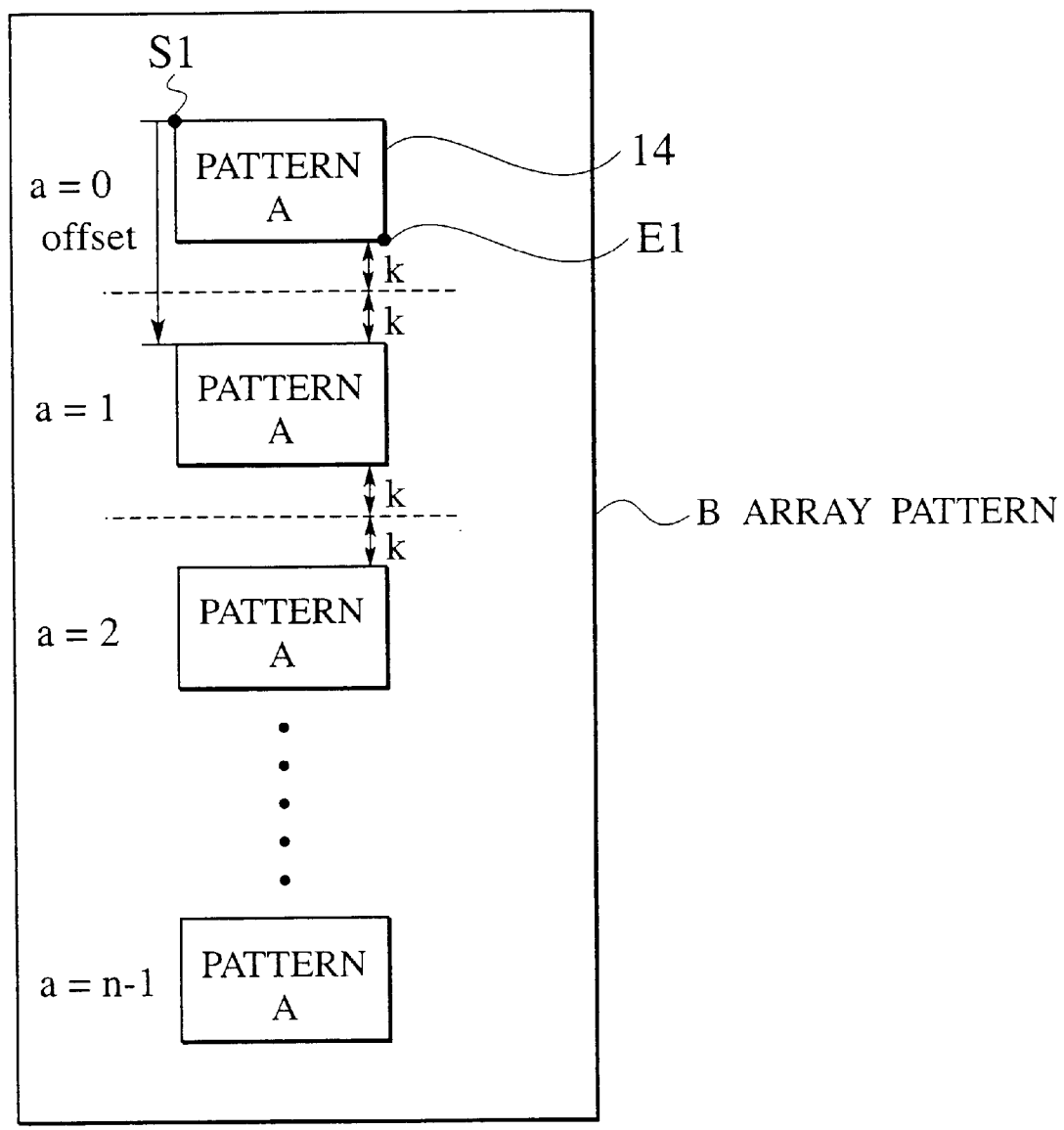
FIG. 32 is an explanatory diagram showing an example of the configuration of an array pattern.
Figure 33:
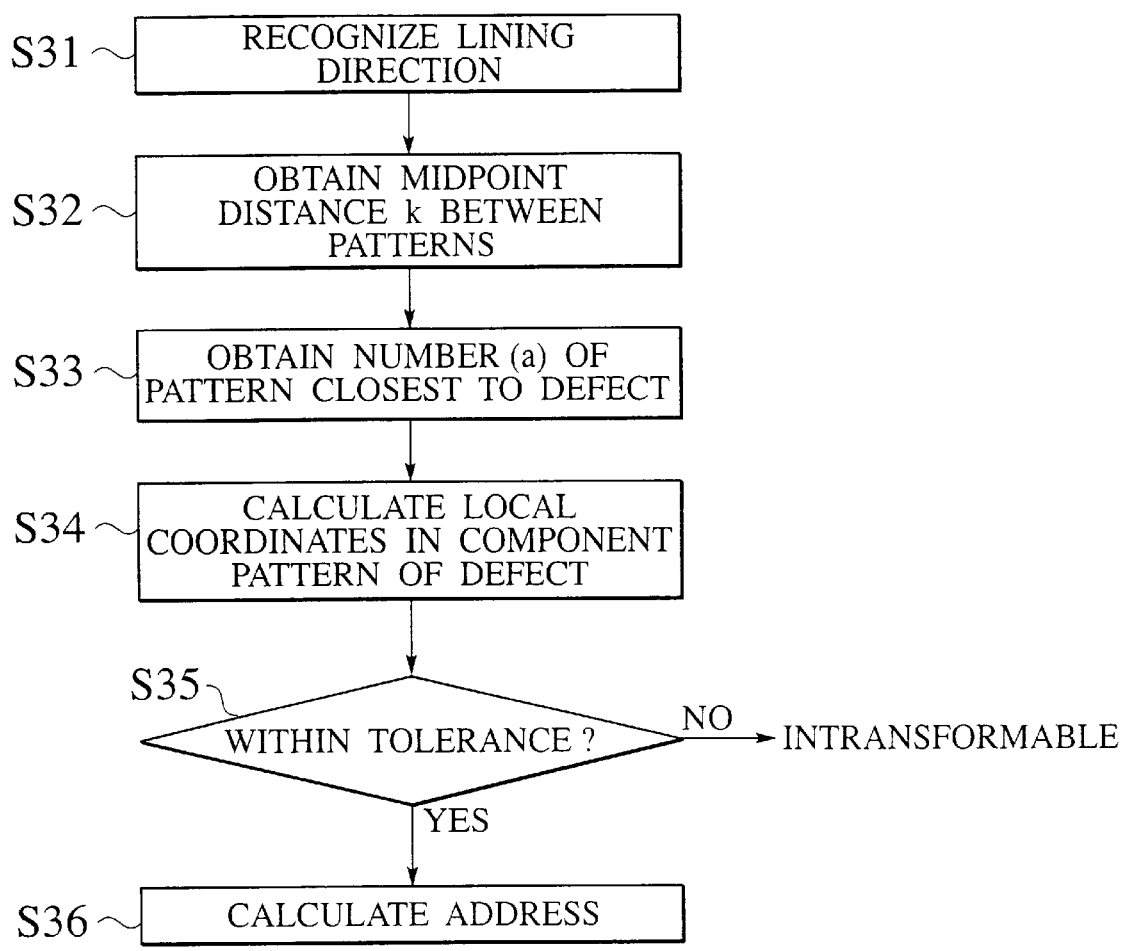
FIG. 33 is a flowchart showing an example of the procedure of an inverse transformation program on the array pattern.
Figure 35:
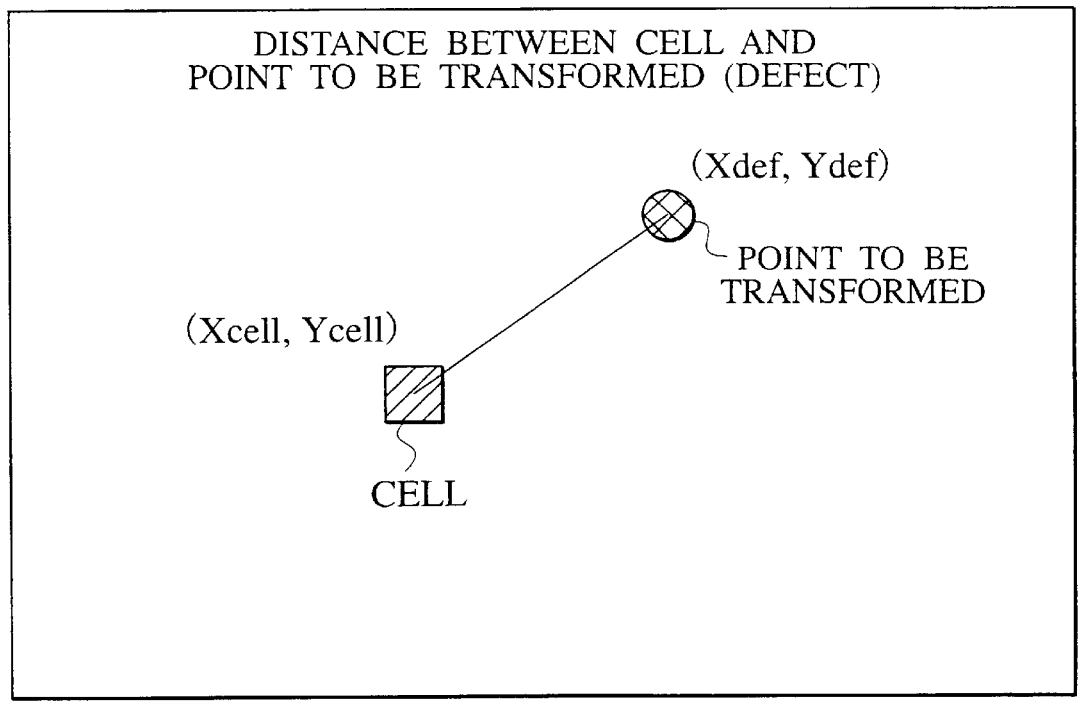
FIG. 35 is an explanatory diagram showing distance between a cell and a point to be transformed (defect data).

FIG. 32 is a diagram showing an example of the configuration of the array pattern, FIG. 33 is a flowchart showing an example of the procedure of the inverse transformation program for the array pattern, and FIGS. 34A and 34B are diagrams showing an example of programming of the procedure shown in FIG. 33.

First, the direction of components lined in the array pattern is checked in step S31.

In the example shown in FIG. 32, (n) pieces of pattern A are disposed so as to line in the Y direction. The pattern outer frame 14 is defined for each pattern A. The coordinate values at the start point of the pattern outer frame 14 are set as (X1, Y1), and the coordinate values at the end point are set as (X2, Y2).

Subsequently, a distance k of a midpoint between patterns is obtained in step S32. To be specific, an area is divided into two at equal distances from neighboring two patterns A. The distance k from an end of each pattern A to the divided line is calculated by the following equation.

$$k=(\text{offset}+Y1-Y2)/2 \qquad (2)$$

The pattern number "a" of a pattern closest to the defect data to be transformed is obtained in step S33. The coordinates of defect data expressed in the FBM physical coordinate system are set as (Xdef, Ydef) and the pattern number "a" of the pattern closest to the defect data is expressed by the following equation.

$$(Y\text{def}+k)/\text{offset}=a \ldots r \qquad (3)$$

(where, when a<0, a is set to 0 (a=0) and when a>(n−1), a=(n−1).)

Coordinates (Xlocal, Ylocal) of the defect data in the local coordinate system in the pattern (pattern number=a) of the defect data can be calculated by the following equation in step S34.

$$(X\text{local},Y\text{local})=(X\text{def},Y\text{def})-(0,a*\text{offset}) \qquad (4)$$

Subsequently, whether the distance between the defect data and the pattern outer frame 14 of the closed pattern (pattern number=a) is within a preset tolerance (t) or not is determined. If the coordinate values (Xlocal, Ylocal) of the defect data satisfy the following expressions, the distance is determined to be within the tolerance (t) in step S35.

$$(X1-t)<X\text{local}<(X2+t) \qquad (5)$$

$$(Y1-t)<Y\text{local}<(Y2+t) \qquad (6)$$

When the distance is within the preset tolerance, the process is shifted to the nearest pattern (pattern number=a). In a case where the nearest pattern is a cell, the coordinate values (Xlocal, Ylocal) of the defect data obtained by Equation 4 are the target coordinate values in step S36.

In a case where the distance is not within the predetermined tolerance, it is regarded that there is no FBM physical address corresponding to the defect data (intransformable) and the process is stopped.

An example of the array pattern in which the components are lined in the Y direction has been described above. FIGS. 34A and 34B illustrate a transformation routine 40, which also includes the processes performed in a case of an array pattern in which the components are lined in the X direction.

The structure CurInfoDef defined in the transformation routine 40 is as follows.

Structure CurInfoDef
(1) Cur_block: current block number
(2) Cur_x: current address X
(3) Cur_y: current address Y
(4) Xdef: defect coordinate X up to the present
(5) Ydef: defect coordinate Y up to the present
(6) Tolerance: predetermined tolerance The transformation routine 40 can be commonly used for all of the array patterns. At the time of actually performing the inverse transformation process on an array pattern, the following information is passed as interface information to the transformation routine 40.

| <Interface Information> | |
|---|---|
| (1) direction: direction of patterns lined | <input> |
| (2) x1, y1: start point of the pattern outer frame of an array pattern | <input> |
| (3) x2, y2: end point of the pattern outer frame of an array pattern | <input> |
| (4) offset: interval between components of an array pattern | <input> |
| (5) n: the number of components of an array pattern | <input> |
| (6) child_pat_block: the size of the component (the number of blocks) (This is used only when the component is defined as a block. In the other cases, "0" is set.) | <input> |
| (7) child_pat_x, child_pat_y: the size of the component (the number of cells) (This is used only when the component is not defined as a block. In the other cases, "0" is set.) | <input> |
| (8) Loc: a variable defined by the structure CurInfoDef | <input/output> |

The interface information (1) to (8) is obtained from preliminarily defined pattern information.

FIGS. 40A and 40B show an example of general subroutine 41 obtained from the transformation routine 40.

Inverse Transformation Program in the Case of Random Pattern

As already described, the random pattern is expressed as a pattern in which the same or different elements are disposed arbitrarily.

Consequently, an element (pattern or cell) nearest to the defect data expressed in the physical coordinate system is obtained. The distance between the defect data and each one of all the components of the random pattern is defined, and the element (pattern or cell) having the shortest distance is selected.

First, the distance between the defect data and each of the components is defined. The definition of the distance in a case where the component is a cell and that in a case where the component is a pattern are different from each other.

Distance between Defect Data and Cell

As shown in FIG. 33, a memory cell is expressed as a point that does not have an area (memory cell is not large but only exists as a center coordinate). When the coordinate values (point to be transformed) of the defect data are (Xdef, Ydef) and the coordinate values of a cell are (Xcell, Ycell), the distance "s" between two points can be expressed by the following equation.

$$s=\max(abs(X\text{def}-X\text{cell}), abs(Y\text{def}-Y\text{cell})) \qquad (7)$$

(where, max denotes a function (FIG. 43) of returning the maximum value, and abs denotes a function of returning an absolute value.)

Figure 36:
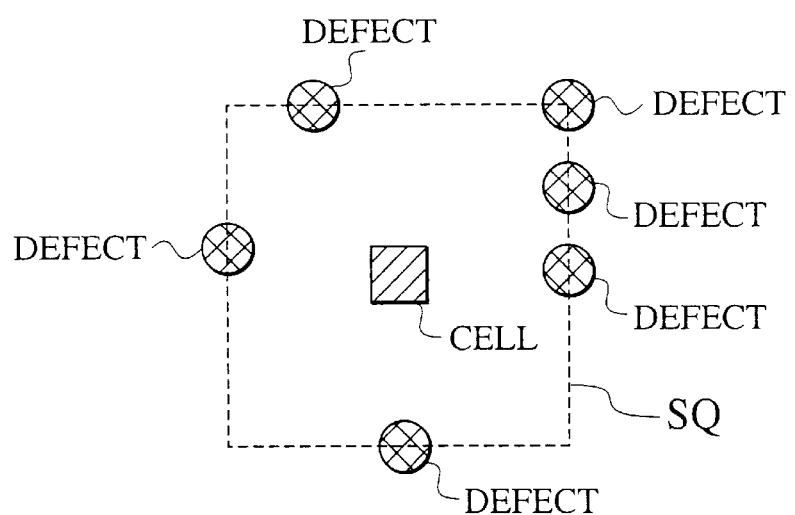
FIG. 36 is an explanatory diagram showing a cell and points to be transformed (defect data) at a constant distance.

As shown in FIG. 36, all of the points to be transformed (defect data) are regarded as points at the same distance from a cell. FIG. 42 shows an example of a routine 43 of calculating the distance between the defect data and a cell on the basis of Equation 7.

Distance between Defect Data and Pattern

Figure 37:
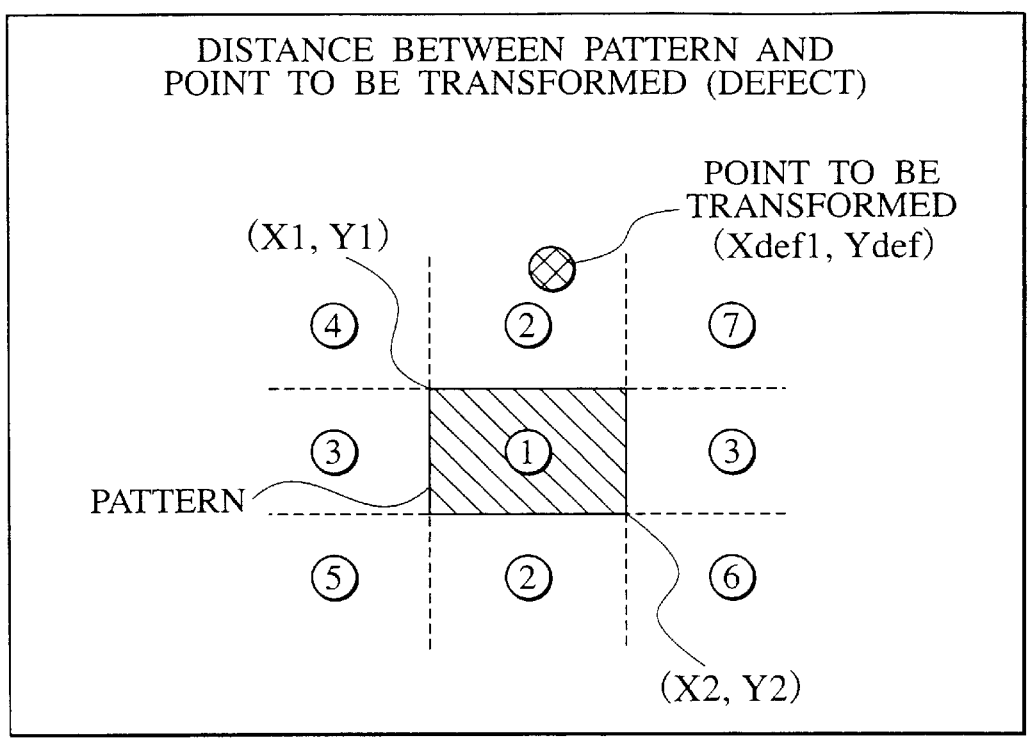
FIG. 37 is an explanatory diagram showing the distance between a pattern and a point to be transformed (defect data).
Figure 38:
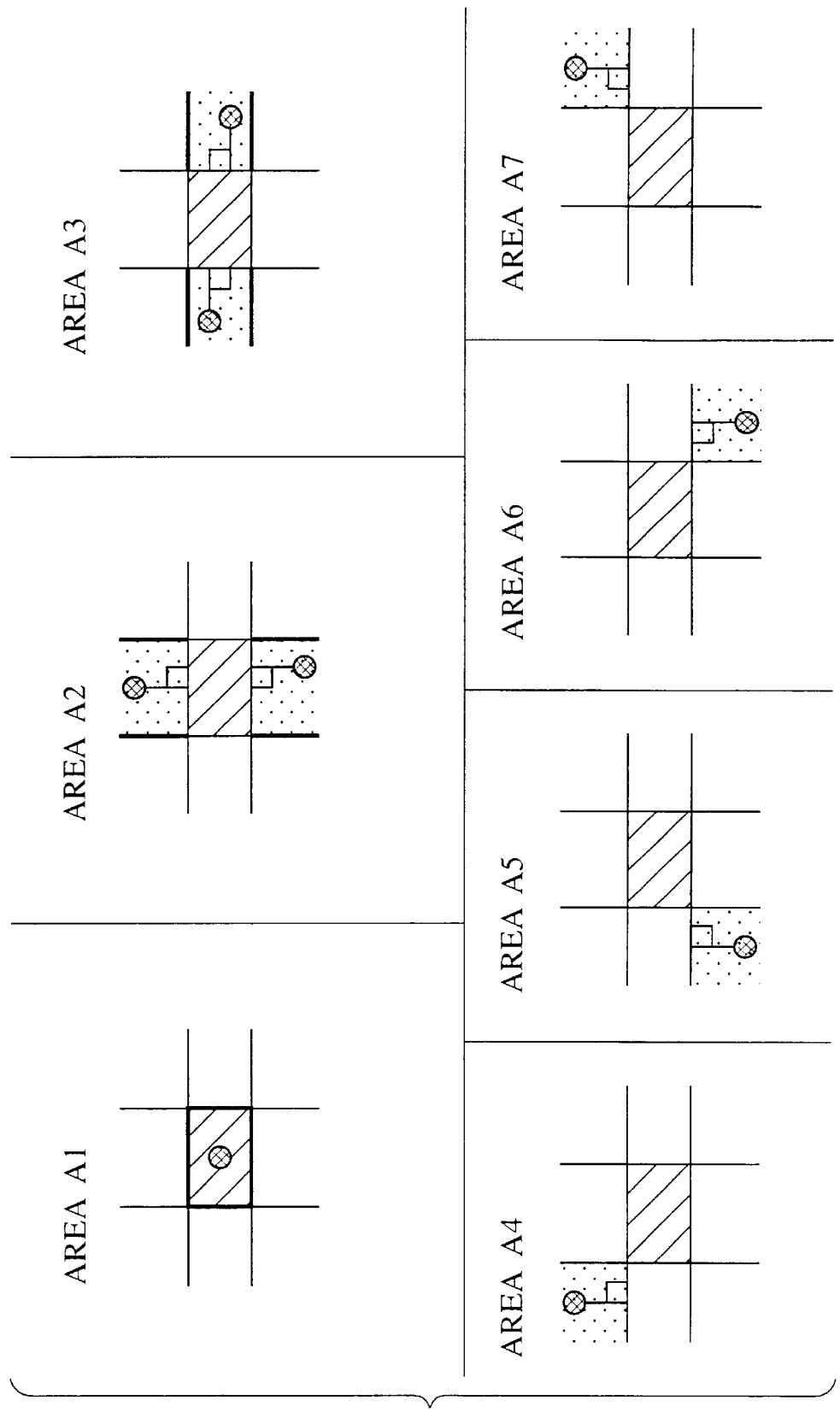
FIG. 38 is an explanatory diagram showing a method of calculating distance between a pattern and a point to be transformed (defect data).

As illustrated in FIG. 37, when the coordinate values (point to be transformed) of defect data is (Xdef, Ydef), the start point of the outer frame of the pattern is (X1, Y1), and the end point of the outer frame of the pattern is (X2, Y2) (where X1<Y2 and Y1<Y2), the distance "s" between the two points is calculated as shown in FIG. 38. In FIG. 38, bold line means a thing including a borderline.

(1) When the defect data is positioned in the area A1, $$s=0 \qquad (8a)$$

(2) When the defect data is positioned in the area A2 (X1≦Xdef≦X2 and (Ydef<Y1 or Y2<Ydef)), that is, when defects exist over and below the pattern, $$s=Y1-Y\text{def} \text{ (where } Y\text{def}<Y1) \qquad (8b)$$

$$s=Y\text{def}-Y2 \text{ (where } Y2<Y\text{def}) \qquad (8c)$$

(3) When the defect data is in the area A3 ((Xdef<X1 or X2<Xdef) and Y1≦Ydef≦Y2), that is, when defects exist on both right and left sides of pattern, $$s=X1-X\text{def} \text{ (where } X\text{def}<X1) \qquad (8d)$$

$$s=X\text{def}-X2 \text{ (where } X2<X\text{def}) \qquad (8e)$$

(4) When the defect data is in the area A4 (Xdef<X1 and Ydef<Y1), $$s=\max((X1-X\text{def}),(Y1-Y\text{def})) \qquad (8f)$$

(5) When the defect data is in the area A5 (Xdef<X1 and Y2<Ydef), $$s=\max((X1-X\text{def}),(Y\text{def}-Y2)) \qquad (8g)$$

(6) When the defect data is in the area A6 (X2<Xdef and Y2<Ydef), $$s=\max((X\text{def}-X2),(Y\text{def}-Y2)) \qquad (8h)$$

(7) When the defect data is in the area A7 (X2<Xdef and Ydef<Y1), $$s=\max((X\text{def}-X2),(Y1-Y\text{def})) \qquad (8i)$$

FIGS. 41A and 41B show an example of a routine 42 of calculating the distance between defect data and a pattern on the basis of the expressions 8a to 8i.

After calculating the distance between the defect data and each of the components, a pattern (nearest pattern) with which the distance "s" is the shortest is extracted, and whether the distance "s" is within the tolerance or not is determined.

When the distance "s" is out of the tolerance, the transformation cannot be performed, and the process is ended.

When the distance "s" is within the tolerance, the address value (Block, X, Y) of the nearest pattern and the physical coordinate value on the random pattern are obtained from the already generated pattern data.

The address value obtained here is stored in Loc: structure CurInfoDef. If there is already a stored address value, the obtained address value (Block, X, Y) is added to the already stored address value, and the resultant value is stored.

After that, the physical coordinate value in the nearest pattern is calculated using the following formula. In the following formula, Fn is physical coordinate value in the nearest pattern, Ff is physical coordinate value of defect data, and Fo is physical coordinate value of the origin of the nearest pattern on the random pattern.

$$Fn = Ff - Fo \quad (9)$$

By using the physical coordinate value in the nearest pattern obtained here as the physical coordinate value of defect data, the process is moved to the nearest pattern. When the nearest pattern is a cell, the obtained physical coordinate value in the nearest pattern is the target coordinate value.

Figure 39:
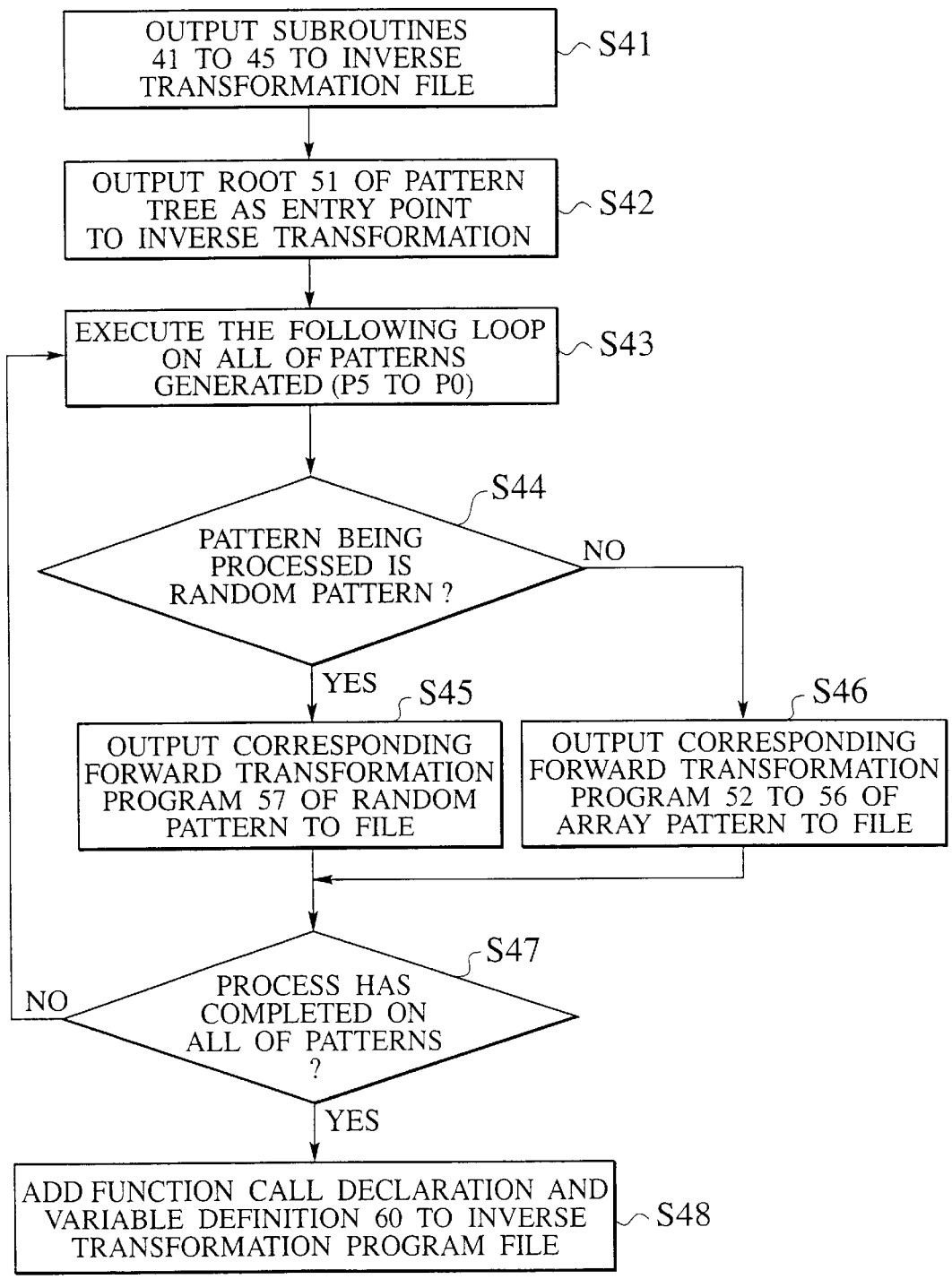
FIG. 39 is a flowchart showing an example of the procedure of an inverse transformation program generating unit in the coordinate transformation system.

The coordinate transformation system 101 programs each of the above-described processing routines for inverse transformation by a procedure shown in FIG. 39. The procedure will be described by using the above-mentioned memory cell configuration and pattern definition shown in FIGS. 19 and 20 as a model.

First, the coordinate transformation system 101 outputs subroutines 41 to 45 to the transformation program output file 104 in step S41. The subroutines are common functions used for the inverse transformation program, and the processes are uniform regardless of the memory cell configuration to be transformed.

The subroutine 45 is, as shown in FIG. 44, a definition module defining the structure CurInfoDef used in the process on the array pattern and the structure NearPatType used in the process on the random pattern.

The coordinate transformation system 101 generates a processing routine 51 by using the root of the pattern tree as an entry point and outputs the resultant value to the transformation program output file 104 in step S42. FIG. 45 shows an example of the processing routine 51 of the entry point. In the example shown in the diagram, the pattern P5 of the root is used as an entry point.

Subsequently, the coordinate transformation system 101 repeats the following process on all of the patterns constructing the pattern tree downward from the root pattern (step S43).

The type of the pattern being processed is determined in step S44. In the case of the random pattern, a transformation program corresponding to the random pattern is generated and output to the transformation program output file 104 in step S45. FIGS. 51A and 51B illustrate a process routine 57 corresponding to the random pattern P0.

When the type of the pattern being processed is the array pattern, a transformation program corresponding to the array pattern is generated and output to the transformation program output file 104 in step S46. Processing routines 52 to 56 corresponding to the array patterns P5 to P1 are illustrated in FIGS. 46A to 50B.

Until the process on all of the patterns constructing the pattern tree is completed (step S47), the processes in steps S44 to S46 are repeated. When the process is completed on all of the patterns, finally, the coordinate transformation system 101 outputs the function call declaration, the variable definition 60, and the like (refer to FIG. 52) to the transformation program output file 104 in step S48.

Figure 55:
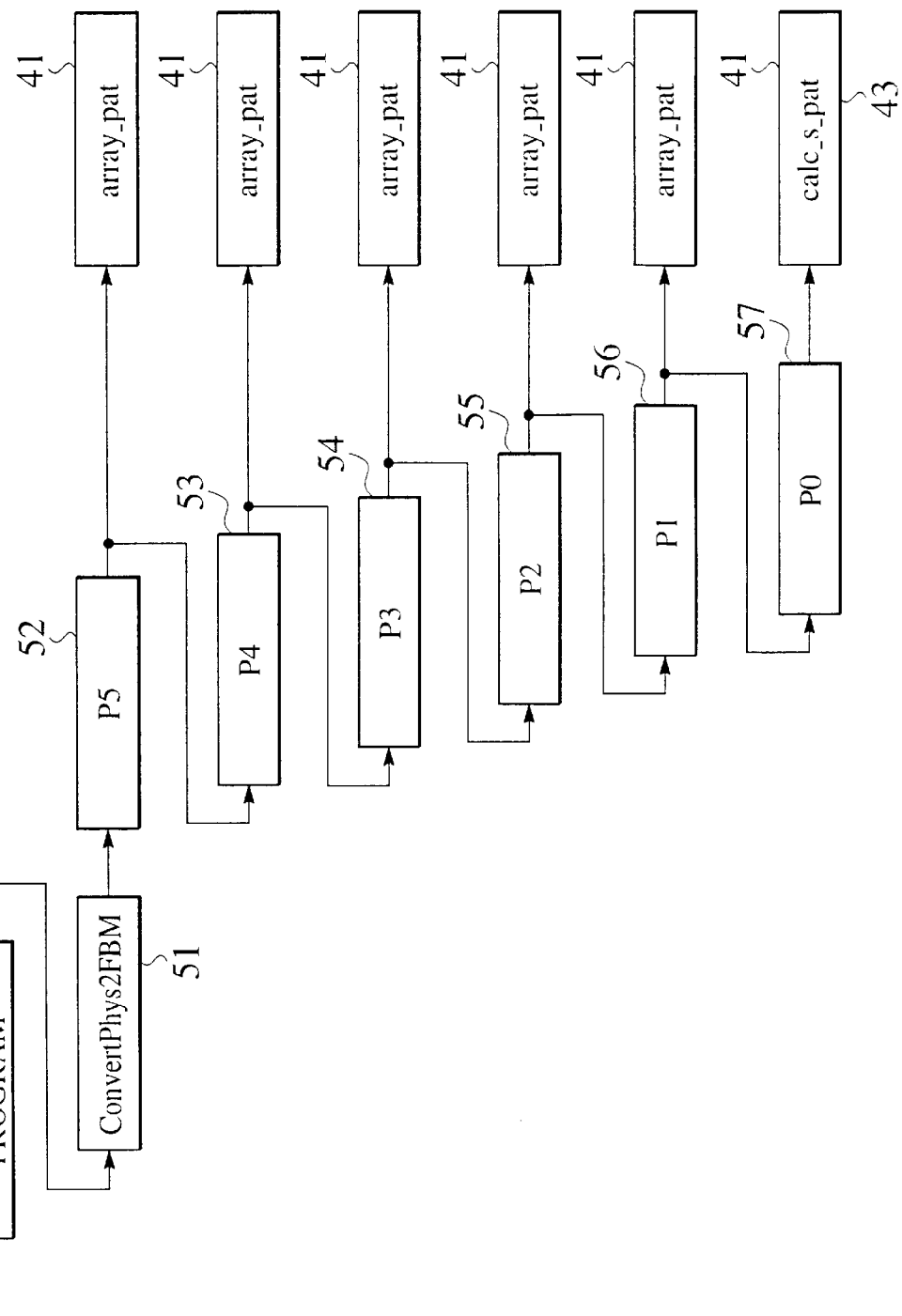
FIG. 55 is a diagram showing a module configuration of the inverse transformation program generated by an inverse transformation program generating unit.

By the above processes, the processing program as an inverse transformation program is generated. FIG. 55 shows a module configuration of the processing program as the inverse transformation program.

Figure 53:
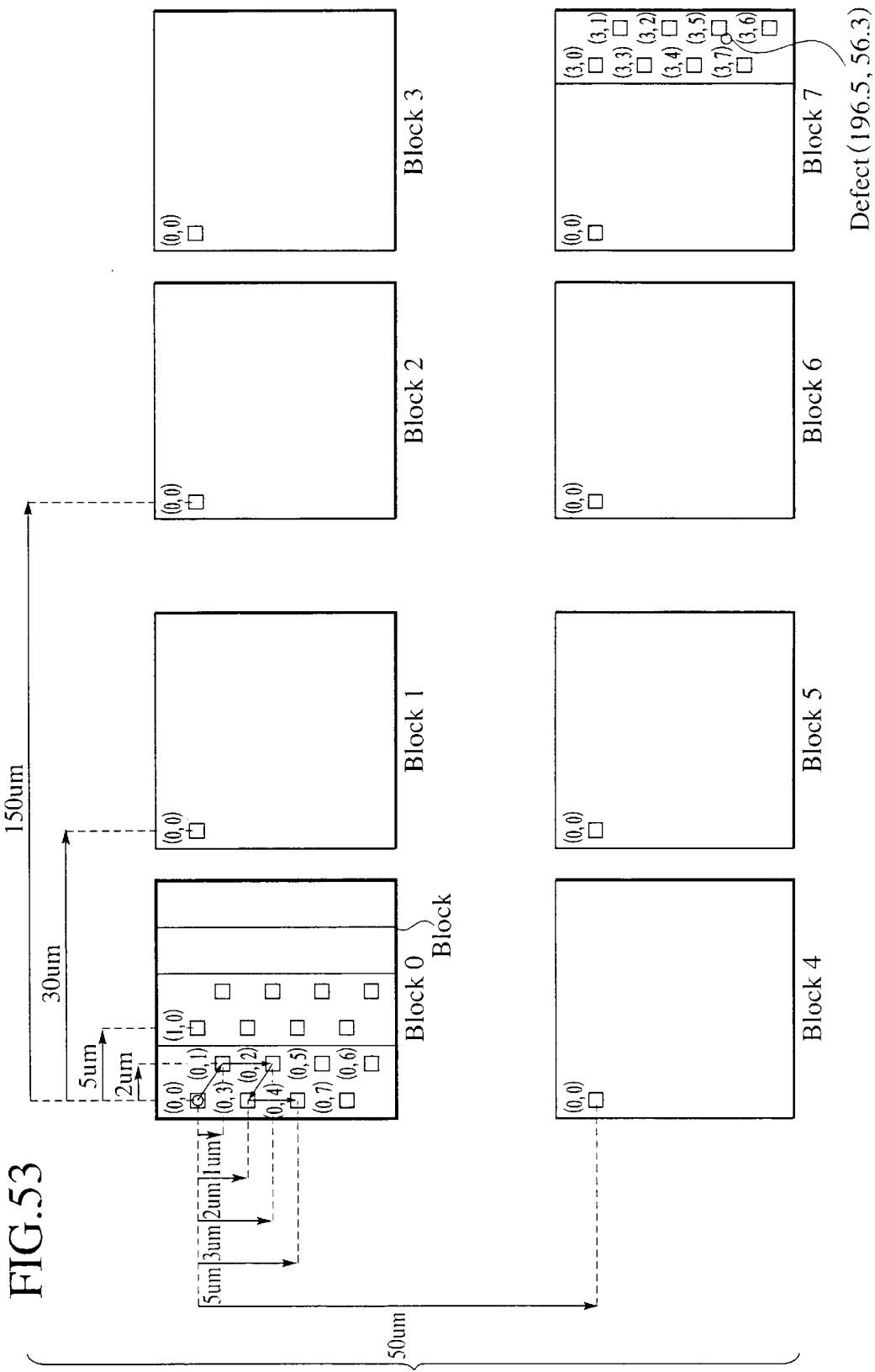
FIG. 53 is a diagram for explaining the inverse transforming process by the inverse transformation program.

When defect data "Defect" having the FBM physical coordinate values (196.3, 56.3) as shown in FIG. 53 is inversely transformed by using the inverse transformation program, the FBM physical address (Block, X, Y)=(7,3,5) can be derived (where size of one block (X, Y)=(4, 8), and tolerance is set as t=10 μmm).

Since the inverse transformation program transforms the FBM physical coordinates to the FBM physical address, the coordinate system of defect data has to be preliminarily transformed to the FBM physical coordinates.

Second Embodiment

In a second embodiment, the transformation result verifying unit 150 for verifying the coordinate transformation result performed by using the units described in the first embodiment will be described.

Figure 54:
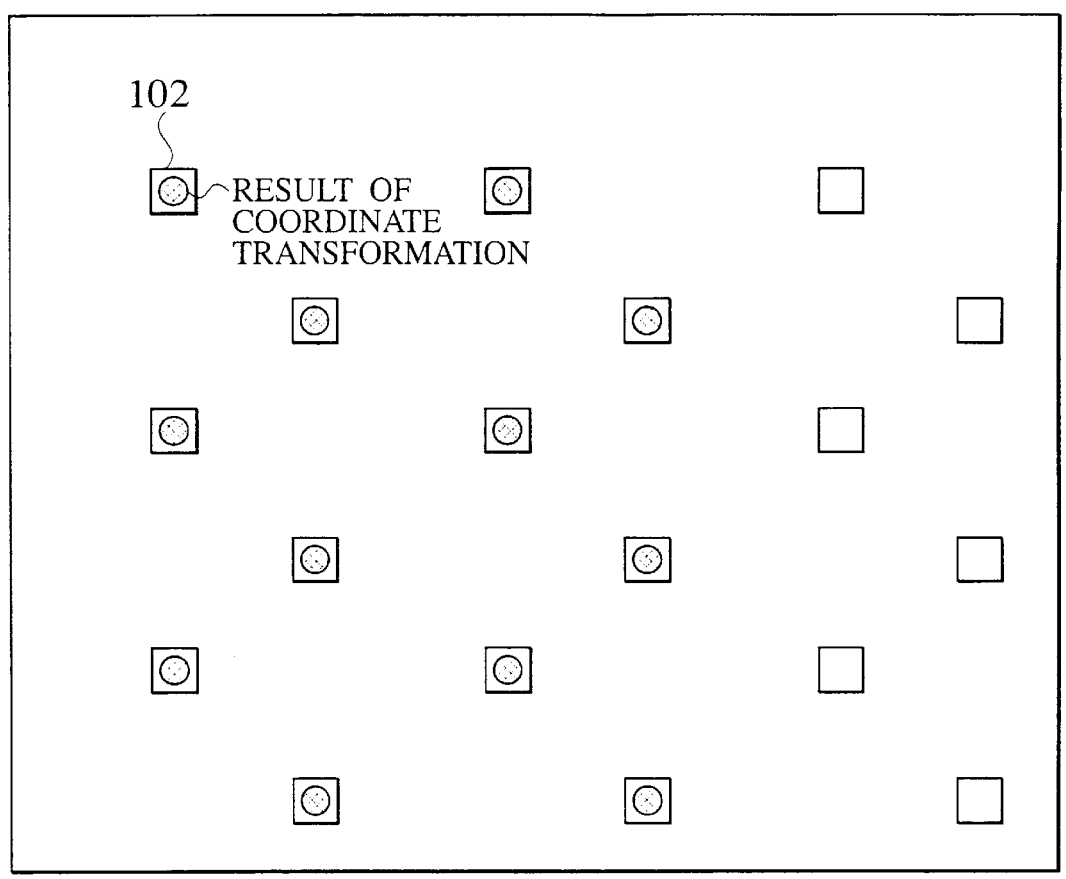
FIG. 54 is an explanatory diagram regarding a transformation result verifying unit in a second embodiment.

The pattern tree of the memory cell configuration is defined by the pattern defining unit 120 on the basis of the layout data 102 and the program of the forward transformation program generated by the forward transformation program generating unit 130 is executed, thereby transforming the physical address of FBM data into the FBM physical coordinates. Further, by transforming the FBM physical coordinates to the layout coordinate system by the layout display unit 110, the layout data 102 and the forward transformation result can be displayed so as to be superimposed on the screen of the display 103 as shown in FIG. 54. In such a manner, the result of the forward transformation can be easily visually verified.

The procedure of verification is as follows. First, the FBM physical address (block, X, Y) to be verified is input from the input device 105, and a program of the forward transformation program generated by the forward transformation program generating unit 130 is executed, thereby transforming the physical address of FBM data into FBM physical coordinates.

The FBM physical coordinates are transformed to layout coordinates, and the point corresponding to the designated FBM physical address (block, X, Y) is displayed so as to be superimposed on the layout data.

At the time of verifying the FBM physical address to be verified, for example, by designating the range (area) like (block, X, Y)=(0, 0 to 1, 0 to 15), the verifying work can be performed at once.

The work is executed on the point or area significant to verification.

When the point of the result of the coordinate transformation is not displayed in an intended position as a result of verification, the defined pattern is re-checked, modified, or the like using the pattern defining unit 120, and the forward transformation program is re-generated by the forward transformation program generating unit 130. When the propriety of the forward transformation result is confirmed, the propriety of the defined pattern tree is also validated.

Therefore, in the case where the inverse transformation program generated by the inverse transformation program generating unit 140 on the basis of the correct pattern tree is proper but the inverse transformation program is verified for the purpose of, for example, adjusting the tolerance, the FBM physical coordinate value to be verified is transformed to the FBM physical address by the inverse transformation program, and the transformed FBM physical address is re-transformed into the FBM physical coordinate value by the forward transformation program. In a manner similar to the verification of the forward transformation program, when the layout-data 102 and the forward transformation result are displayed so as to be superimposed on the screen of the display device 105, the inverse transformation program can be verified.

Third Embodiment

In the first and second embodiments, the forward transformation program for transforming the FBM physical address to the FBM physical coordinates and the inverse transformation program for transforming the FBM physical coordinates to the FBM physical address have been described. In a third embodiment, a forward transformation program for transforming the FBM physical address to a physical coordinate system of defect data and an inverse transformation program for transforming the physical coordinates of defect data into the FBM physical address will be described in detail.

First, the coordinate transformation system 101 displays the layout data 102 on the screen of the display device 103 by the transformation result verifying unit 150 and superimposes the FBM physical coordinates on the layout data 102.

The user designates the origin O4 of the defect data coordinates on the layout displayed on the screen using the pointing device or the like.

The coordinate transformation system 101 can map the FBM physical coordinate system to the defect data coordinate system from relative coordinates between the origin O4 of the defect data coordinates designated by the user and the origin O3 of the FBM physical coordinate system superimposed on the layout.

By adding the process of mapping the FBM physical coordinate system to the defect data coordinate system to the forward transformation program, the forward transformation program for transforming the FBM physical address to the physical coordinate system of the defect data can be generated.

The forward transformation program for transforming the FBM physical address to the physical coordinate system of defect data can be used, for example, in the case of comparing the coordinates of the FBM data with those of defect data and the case of displaying the FBM physical address on the basis of actual cell arrangement.

On the contrary, when the process of mapping the defect data coordinate system to the FBM physical coordinate system is added to the inverse transformation program, the inverse transformation program for transforming the physical coordinate system of the defect data to the FBM physical address can be generated.

The inverse transformation program for transforming the defect data physical coordinate system to the FBM physical address can be used, for example, in the case of comparing the coordinates of FBM data and those of defect data, displaying the position of defect data so as to be superimposed on addressed FBM data, and displaying the coordinates of defect data in address.

In a case of displaying defect data having an area, the shape of the defect data is expressed in, for example, a rectangular shape, and the physical coordinate values at the four corners of the rectangle are transformed into the FBM physical addresses. The four points are plotted to corresponding positions on the addressed FBM data, and the inside of the four points is shaded in.

In a case of expressing the shape of the defect data, it is sufficient to express the shape as a polygon, transform the physical coordinate value at each of the vertexes of the polygon into the FBM physical address, plot the points to corresponding positions on the addressed FBM data, and shade in the inside of the points.

In the coordinate transformation system according to the embodiment, by defining the relationship between the FBM physical address and the FBM physical coordinates by a combination of the random and array patterns, the coordinate transformation program (forward transformation program) from the FBM physical address system to the FBM physical coordinate system or the coordinate transformation program (inverse transformation program) from the FBM physical coordinate system to the FBM physical address system can be generated extremely easily.

The result of transformation by the generated coordinate transformation program can be displayed so as to be superimposed on the layout data of the semiconductor device on the screen, so that the result of transformation can be easily verified.

Further, by mapping the FBM physical coordinate system to the defect data coordinate system or mapping the defect data coordinate system to the FBM physical coordinate system on the layout displayed on the screen, the forward transformation program for transforming the FBM physical address system to the defect data coordinate system or the inverse transformation program for transforming the defect data coordinate system to the FBM physical address system can be easily generated.

By using the coordinate transformation program according to the present embodiment, the time and cost required to generate the coordinate transformation program can be largely reduced as compared with the conventional technique, and the time required to verify the transformation program can be also reduced. Thus, the cost of a semiconductor device to be fabricated can be reduced and reliability can be improved.

Although the embodiments of the present invention have been described in detail, the invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A system for transforming a coordinate assigned in a semiconductor device, the system comprising:

a layout display unit configured to obtain an arbitrary point in layout data of a circuit pattern of the semiconductor device displayed on a screen of a display device as a physical coordinate value of an fail bit map (FBM) physical coordinate system indicative of a physical position on the semiconductor device;

a pattern defining unit configured to define a relationship between an FBM physical address and the physical coordinates of the FBM physical coordinate system using a pattern tree obtained by combining an array pattern, defining lining direction, interval, and the number of components to be disposed at equal intervals, with a random pattern, defining the relationship between the FBM physical address as a coordinate system of FBM data indicative of a relative positional relation of an electric failure position obtained by a test process of the semiconductor device and the physical coordinates of the FBM physical coordinate system in a one-to-one corresponding manner; and a forward transformation program generating unit configured to generate a forward transformation program to transform the FBM physical address of the semiconductor device into the physical coordinates of the FBM physical coordinate system from the pattern defined.

2. The system of claim 1, wherein said layout display unit designates an origin of the FBM physical coordinate system on the screen on which the layout data is displayed, obtains relative coordinates between the origin of the designated FBM physical coordinate system and the origin of the layout data, and obtains the arbitrary point in the layout data as the physical coordinate value of the FBM physical coordinate system by mapping between a coordinate system of the layout and the FBM physical coordinate system on the basis of the relative coordinates obtained.

3. The system of claim 1, wherein said layout display unit designates an origin of a coordinate system of defect data obtained in a defect inspection process of the semiconductor device on the screen on which the layout data is displayed, obtains relative coordinates between the origin of the coordinate system of the designated defect data and the origin of the FBM physical coordinate system, and obtains the arbitrary point of the defect data as a physical coordinate value of the FBM physical coordinate system by mapping between a coordinate system of the defect data and the FBM physical coordinate system on the basis of the relative coordinates obtained.

4. The system of claim 1, wherein said forward transformation program generating unit generates the forward transformation program including:

obtaining position of a component to which an address in a pattern belongs and an address in a lower pattern in the pattern tree, in a case where the pattern defined is the array pattern; and obtaining physical coordinates in a pattern corresponding to the address in the pattern and an address in a lower pattern in the pattern tree, in a case where the pattern defined is the random pattern.

5. The system of claim 1, further comprising an inverse transformation program generating unit configured to generate an inverse transformation program to transform the physical coordinates of the FBM physical coordinate system of the semiconductor device into the FBM physical address from the pattern defined.

6. The system of claim 5, wherein said inverse transformation program generating unit generates the inverse transformation program including:

obtaining a component nearest to a coordinate position expressed in the FBM physical coordinate system and obtaining physical coordinates in the pattern in the obtained component, in a case where the pattern defined is the array pattern; and obtaining a component nearest to a coordinate position expressed in the FBM physical coordinate system and obtaining the physical coordinates in the pattern of the obtained component, in a case where the defined pattern is the random pattern.

7. The system of claim 1, further comprising a transformation result verifying unit configured to transform the FBM physical address in the semiconductor device to the physical coordinates of the FBM physical coordinate system using the forward transformation program, to transform the transformed FBM physical coordinates into layout coordinates, and to display a result of the transformation by the forward transformation program and the layout data so as to be superimposed on the screen of the display device.

8. The system of claim 5, further comprising a transformation result verifying unit configured to transform the FBM physical address in the semiconductor device to the physical coordinates of the FBM physical coordinate system using the forward transformation program, to transform the transformed FBM physical coordinates into layout coordinates, and to display a result of the transformation by the forward transformation program and the layout data so as to be superimposed on the screen of the display device.

9. The system of claim 8, wherein said transformation result verifying unit transforms the FBM physical coordinates to the FBM physical address using the inverse transformation program, transforms the transformed FBM physical address to the physical coordinates of the FBM physical coordinate system using the forward transformation program, transforms the transformed FBM physical coordinates to layout coordinates, and displays the result of transformation by the inverse transformation program and the layout data so as to be superimposed on the screen of the display device.

10. A computer implemented method for transforming a coordinate in a semiconductor device, the method comprising:

obtaining an arbitrary point in layout data of a circuit pattern of the semiconductor device displayed on a screen of a display device as a physical coordinate value of an FBM physical coordinate system indicative of a physical position on the semiconductor device;

defining a relationship between an FBM physical address and the physical coordinates of the FBM physical coordinate system using a pattern tree obtained by combining an array pattern, defining lining direction, interval, and the number of components to be disposed at equal intervals, with a random pattern, defining the relationship between the FBM physical address as a coordinate system of FBM data indicative of a relative positional relation of an electric failure position obtained by a test process of the semiconductor device and the physical coordinates of the FBM physical coordinate system in a one-to-one corresponding manner;

generating a forward transformation program to transform the FBM physical address of the semiconductor device into the FBM physical coordinates from the pattern defined; and transforming the FBM physical address of the semiconductor device into the physical coordinates of the FBM physical coordinate system by executing the forward transformation program.

11. The method of claim 10, wherein said obtaining of the coordinate value of the FBM physical coordinate system includes:

designating an origin of the FBM physical coordinate system on the screen on which the layout data is displayed;

obtaining relative coordinates between the origin of the designated FBM physical coordinate system and the origin of the layout data; and obtaining the arbitrary point in the layout data as the physical coordinate value of the FBM physical coordinate system by mapping between a coordinate system of the layout and the FBM physical coordinate system on the basis of the relative coordinates obtained.

12. The method of claim 10, wherein said obtaining of the coordinate value of the FBM physical coordinate system includes:

designating an origin of a coordinate system of defect data obtained in a defect inspection process of the semiconductor device on the screen on which the layout data is displayed;

obtaining relative coordinates between the origin of the coordinate system of the designated defect data and the origin of the FBM physical coordinate system; and obtaining the arbitrary point of the defect data as a physical coordinate value of the FBM physical coordinate system by mapping a coordinate system of the defect data and the FBM physical coordinate system on the basis of the relative coordinates obtained.

13. The method of claim 10, wherein the forward transformation program includes:

obtaining position of a component to which an address in the pattern belongs and an address in a lower pattern in the pattern tree, in a case where the pattern defined is the array pattern; and obtaining physical coordinates in a pattern corresponding to the address in the pattern and an address in a lower pattern in the pattern tree, in a case where the pattern defined is the random pattern.

14. The method of claim 10, further comprising:

generating an inverse transformation program to transform the FBM physical coordinates of the semiconductor device into the FBM physical address from the pattern defined; and transforming the physical coordinates of the FBM physical coordinate system of the semiconductor device into the FBM physical address by executing the inverse transformation program.

15. The method of claim 14, wherein the inverse transformation program includes:

obtaining a component nearest to a coordinate position expressed in the FBM physical coordinate system and obtaining physical coordinates in the pattern in the obtained component, in a case where the pattern defined is the array pattern; and obtaining a component nearest to a coordinate position expressed in the FBM physical coordinate system and obtaining physical coordinates in the pattern of the obtained component, in a case where the defined pattern is the random pattern.

16. The method of claim 10, further comprising:

transforming the FBM physical address in the semiconductor device to the physical coordinates of the FBM physical coordinate system using the forward transformation program;

transforming the transformed FBM physical coordinates into layout coordinates; and displaying a result of the transformation by the forward transformation program and the layout data so as to be superimposed on the screen of the display device.

17. The method of claim 14, further comprising:

transforming the FBM physical address in the semiconductor device to the physical coordinates of the FBM physical coordinate system by the forward transformation program;

transforming the transformed FBM physical coordinates into layout coordinates; and displaying a result of the transformation by the forward transformation program and the layout data so as to be superimposed on the screen of the display device.

18. The method of claim 17, wherein said verifying of the transformation result includes:

transforming the FBM physical coordinates to the FBM physical address by the inverse transformation program;

transforming the transformed FBM physical address to the physical coordinates of the FBM physical coordinate system using the forward transformation program;

transforming the transformed FBM physical coordinates to layout coordinates; and displaying the result of the transformation by the inverse transformation program and the layout data so as to be superimposed on the screen of the display device.

19. A program for controlling a coordinate transformation system for a semiconductor device, the program comprising:

obtaining a position of a component to which an address in a pattern belongs and an address in a lower pattern in a pattern tree in a case where the pattern defined is an array pattern;

obtaining physical coordinates in the pattern corresponding to the address in the pattern and the address in the lower pattern in the pattern tree in a case where the pattern defined is a random pattern;

executing the above process on each pattern downward from the highest pattern to the lowest pattern in the pattern tree, the pattern tree obtained by combining the array pattern, defining a lining direction, interval, and the number of components disposed at equal intervals, with the random pattern, defining a relationship between an FBM physical address as a coordinate system of FBM data indicative of a relative positional relation of an electric failure position obtained by a test process of the semiconductor device and physical coordinates of an FBM physical coordinate system indicative of a physical position on layout data of a circuit pattern of the semiconductor device in a one-to-one corresponding manner; and obtaining a coordinate value finally derived as the physical coordinates of the FBM physical coordinate system corresponding to the FBM physical address value to be transformed.

20. A program for controlling a coordinate transformation system for a semiconductor device, the program comprising:

obtaining a component nearest to a coordinate position expressed in an FBM physical coordinate system of components constructing a pattern, obtaining local coordinates in the component obtained in a case where the pattern defined is an array pattern;

obtaining a component nearest to the coordinate position expressed in the FBM physical coordinate system of components constructing the pattern, and obtaining physical coordinates in the component obtained, in a case where the pattern defined is a random pattern;

executing the above process on each pattern downward from the highest pattern to the lowest pattern in a pattern tree, the pattern tree obtained by combining the array pattern, defining a lining direction, interval, and the number of components disposed at equal intervals, with the random pattern, defining a relationship between an FBM physical address as a coordinate system of FBM data indicative of a relative positional relation of an electric failure position obtained by a test process of the semiconductor device and physical coordinates of an FBM physical coordinate system indicative of a physical position on layout data of a circuit pattern of the semiconductor device in a one-to-one corresponding manner; and obtaining a coordinate value finally derived as the physical coordinates of the FBM physical coordinate system corresponding to the FBM physical address value to be transformed.

21. A system for transforming a coordinate assigned in a semiconductor device, the system comprising:

a layout display unit configured to obtain an arbitrary point in layout data of the semiconductor device displayed on a screen of a display device as a coordinate value of an FBM physical coordinate system indicative of a physical position on the semiconductor device;

a pattern defining unit configured to define a relationship between an FBM physical address and the FBM physical coordinates using a pattern tree obtained by combining an array pattern, defining lining direction, interval, and the number of components to be disposed at equal intervals, with a random pattern, defining the relationship between the FBM physical address as a coordinate system of FBM data indicative of an electric failure position obtained by a test process of the semiconductor device and the FBM physical coordinates in a one-to-one corresponding manner;

a forward transformation program generating unit configured to generate a forward transformation program to transform the FBM physical address of the semiconductor device into the FBM physical coordinates from the pattern defined; and an inverse transformation program generating unit configured to generate an inverse transformation program to transform the FBM physical coordinates of the semiconductor device into the FBM physical address from the pattern defined.

22. The system of claim 21, wherein said inverse transformation program generating unit generates the inverse transformation program including:

obtaining a component nearest to a coordinate position expressed in the FBM physical coordinate system and obtaining physical coordinates in the pattern in the obtained component, in a case where the pattern defined is the array pattern; and obtaining a component nearest to a coordinate position expressed in the FBM physical coordinate system and obtaining the physical coordinates in the pattern of the obtained component, in a case where the defined pattern is the random pattern.

23. The system of claim 21, further comprising a transformation result verifying unit configured to transform the FBM physical address in the semiconductor device to FBM physical coordinates using the forward transformation program, to transform the transformed FBM physical coordinates into layout coordinates, and to display a result of the transformation by the forward transformation program and the layout data so as to be superimposed on the screen of the display device.

24. A computer implemented method for transforming a coordinate in a semiconductor device, the method comprising:

obtaining an arbitrary point in layout data of the semiconductor device displayed on a screen of a display device as a coordinate value of an FBM physical coordinate system indicative of a physical position on the semiconductor device;

defining a relationship between an FBM physical address and the FBM physical coordinates using a pattern tree obtained by combining an array pattern, defining lining direction, interval, and the number of components to be disposed at equal intervals, with a random pattern, defining the relationship between the FBM physical address as a coordinate system of FBM data indicative of an electric failure position obtained by a test process of the semiconductor device and the FBM physical coordinates in a one-to-one corresponding manner;

generating a forward transformation program to transform the FBM physical address of the semiconductor device into the FBM physical coordinates from the pattern defined; transforming the FBM physical address of the semiconductor device into the FBM physical coordinates by executing the forward transformation program;

generating an inverse transformation program to transform the FBM physical coordinates of the semiconductor device into the FBM physical address from the pattern defined; and transforming the FBM physical coordinates of the semiconductor device into the FBM physical address by executing the inverse transformation program.

25. The method of claim 24, wherein the inverse transformation program includes:

obtaining a component nearest to a coordinate position expressed in the FBM physical coordinate system and obtaining physical coordinates in the pattern in the obtained component, in a case where the pattern defined is the array pattern; and obtaining a component nearest to a coordinate position expressed in the FBM physical coordinate system and obtaining physical coordinates in the pattern of the obtained component, in a case where the defined pattern is the random pattern.

26. The method of claim 24, further comprising:

transforming the FBM physical address in the semiconductor device to the FBM physical coordinates by the forward transformation program;

transforming the transformed FBM physical coordinates into layout coordinates; and displaying a result of the transformation by the forward transformation program and the layout data so as to be superimposed on the screen of the display device.

27. A program for controlling a coordinate transformation system for a semiconductor device, the program comprising:

obtaining a component nearest to a coordinate position expressed in an FBM physical coordinate system of components constructing a pattern, obtaining local coordinates in the component obtained in a case where the pattern defined is an array pattern;

obtaining a component nearest to the coordinate position expressed in the FBM physical coordinate system of components constructing the pattern, and obtaining physical coordinates in the component obtained, in a case where the pattern defined is a random pattern;

executing the above process on each pattern downward from the highest pattern to the lowest pattern in a pattern tree, the pattern tree obtained by combining the array pattern, defining a lining direction, interval, and the number of components disposed at equal intervals, with the random pattern, defining a relationship between an FBM physical address as a coordinate system of FBM data indicative of an electric failure position obtained by a test process of the semiconductor device and the FBM physical coordinates indicative of a physical position on the semiconductor device in a one-to-one corresponding manner; and obtaining a coordinate value finally derived as the FBM physical coordinate value corresponding to the FBM physical address value to be transformed.

* * * * *